(12) United States Patent
Nomura et al.

(10) Patent No.: US 11,881,702 B2
(45) Date of Patent: Jan. 23, 2024

(54) SWITCHING MODULE

(71) Applicant: Murata Manufacturing Co., Ltd., Nagaokakyo (JP)

(72) Inventors: Hideaki Nomura, Nagaokakyo (JP); Michiya Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 381 days.

(21) Appl. No.: 17/353,883

(22) Filed: Jun. 22, 2021

(65) Prior Publication Data

US 2021/0313893 A1 Oct. 7, 2021

Related U.S. Application Data

(63) Continuation of application No. PCT/JP2019/044852, filed on Nov. 15, 2019.

(30) Foreign Application Priority Data

Dec. 26, 2018 (JP) .................................. 2018-242050
May 10, 2019 (JP) .................................. 2019-089527

(51) Int. Cl.
*H02H 1/00* (2006.01)
*H03K 17/18* (2006.01)
(Continued)

(52) U.S. Cl.
CPC ........... *H02H 1/0007* (2013.01); *H03K 17/18* (2013.01); *G01R 31/263* (2013.01); *H02H 3/05* (2013.01)

(58) Field of Classification Search
CPC .................. H02H 1/007; G01R 31/263
See application file for complete search history.

(56) References Cited

U.S. PATENT DOCUMENTS 6,211,792 B1 * 4/2001 Jadric .................. H02H 7/0844
340/662
6,404,346 B1 * 6/2002 Jadric .................. G01R 31/263
361/100

(Continued)

FOREIGN PATENT DOCUMENTS

JP 50-22244 A 3/1975
JP 63-176330 U 11/1988

(Continued)

OTHER PUBLICATIONS

Official Communication issued in International Patent Application No. PCT/JP2019/044852, dated Jan. 7, 2020.

*Primary Examiner* — Peter M Novak
(74) *Attorney, Agent, or Firm* — KEATING & BENNETT, LLP

(57) ABSTRACT

A switching module includes a determiner to open a first bidirectional switch and close a second bidirectional switch from a first time point over a testing period to determine that the first bidirectional switch has a short circuit failure when a differential absolute value of voltage values detected by voltmeters is equal to a preset voltage threshold value or less, and to open the first bidirectional switch and close the second bidirectional switch from a second time point after a period of n+½ times, where n is a positive integer, the set cycle from the first time point elapses, over a testing period to determine that the first bidirectional switch has a short circuit failure when a differential absolute value of the voltage values detected by the voltmeters is equal to the voltage threshold value or less.

18 Claims, 14 Drawing Sheets

(51) Int. Cl.
   *G01R 31/26*  (2020.01)
   *H02H 3/05*  (2006.01)

(56) References Cited

U.S. PATENT DOCUMENTS

2021/0036698 A1* 2/2021 Nakano .............. H03K 17/0824
2023/0100212 A1* 3/2023 Ogino ..................... H05B 1/02
                                                        324/132

FOREIGN PATENT DOCUMENTS

| JP | 06-22446 A | 1/1994 |
| JP | 06-86480 A | 3/1994 |
| JP | 2003-102101 A | 4/2003 |
| JP | 2018-066678 A | 4/2018 |

\* cited by examiner

SWITCHING MODULE

CROSS REFERENCE TO RELATED APPLICATIONS

This application claims the benefit of priority to Japanese Patent Application No. 2018-242050 filed on Dec. 26, 2018 and Japanese Patent Application No. 2019-089527 filed on May 10, 2019, and is a Continuation Application of PCT Application No. PCT/JP2019/044852 filed on Nov. 15, 2019. The entire contents of each application are hereby incorporated herein by reference.

BACKGROUND OF THE INVENTION

1. Field of the Invention

The present disclosure relates to a switching module.

2. Description of Related Art

An AC power controller including a thyristor for each of three bus lines connecting an AC power supply, which outputs three-phase AC power, and a load may be provided with an element failure detector that detects a failure in the thyristor (refer to, for example, Japanese Laid-Open Patent Publication No. 6-22446). The element failure detector includes a current transformer and an adder that detect the current flowing to the load, a control circuit that outputs an element-on signal at different time points to each thyristor corresponding to a different phase, and a determining means that determines whether the thyristor corresponding to each phase has a failure from the element-on signal and the outputs of the current transformer and the adder.

The element failure detector described in Japanese Laid-Open Patent Publication No. 6-22446 temporarily deactivates the thyristor that is subject to testing by decreasing the current flowing through the bus lines. Thus, when using the element failure detector, the power supplied to the load from the AC power supply needs to be decreased when checking for failures in the thyristors. When the load is, for example, a server that has to be constantly operated, the source of the power supplied to the load is switched to a backup AC power supply whenever checking for failures in thyristors. This increases work for a person checking the thyristors.

SUMMARY OF THE INVENTION

Preferred embodiments of the present invention provide switching modules that each enable determination of whether a bidirectional switch has a failure without decreasing the power supplied to a load from an AC power supply.

A switching module according to a preferred embodiment of the present invention includes at least one combination of two input terminals, to which an AC voltage of a set cycle that is set in advance is applied, and two output terminals, which are connected to a power conversion circuit. The switching module includes, in a combination of the two input terminals and the two output terminals selected from the at least one combination of the two input terminals and the two output terminals, a first bidirectional switch connected in series between one of the two input terminals and one of the two output terminals; a second bidirectional switch connected in series between another one of the two input terminals and another one of the two output terminals; a first voltmeter that detects a first voltage value corresponding to an electric potential difference of an electric potential between the one of the two input terminals and the first bidirectional switch and an electric potential between the another one of the two input terminals and the second bidirectional switch; a second voltmeter that detects a second voltage value corresponding to an electric potential difference of an electric potential between the one of the two output terminals and the first bidirectional switch and an electric potential between the another one of the two output terminals and the second bidirectional switch; and a determiner that determines whether the first bidirectional switch has a short circuit failure. The determiner opens the first bidirectional switch and closes the second bidirectional switch from a first time point over a first testing period, which has a length of less than or equal to one-half of the set cycle, to obtain the first voltage value and the second voltage value and determine that the first bidirectional switch has a short circuit failure when a first differential value of the obtained first voltage value and second voltage value is less than or equal to a preset first voltage threshold value, and when determining from the first voltage value and the second voltage value, which are obtained from the first time point to when the first testing period elapses, that the first bidirectional switch is functioning normally, the determiner opens the first bidirectional switch and closes the second bidirectional switch from a second time point, which is after a period of n+½ times, where n is a positive integer, the set cycle from the first time point elapses, over a second testing period, which has a length of less than or equal to one-half of the set cycle, to obtain the first voltage value and the second voltage value and determine that the first bidirectional switch has a short circuit failure when a second differential value of the obtained first voltage value and second voltage value is less than or equal to the first voltage threshold value.

In a switching module according to a preferred embodiment of the present invention, the first voltmeter is connected to an input terminal of the first bidirectional switch and an input terminal of the second bidirectional switch, and the second voltmeter is connected to an output terminal of the first bidirectional switch and an output terminal of the second bidirectional switch.

In a switching module according to a preferred embodiment of the present invention, the length of the first testing period and the length of the second testing period are about 0.3 times or greater and about 0.5 times or less than the set cycle.

In a switching module according to a preferred embodiment of the present invention, the first bidirectional switch includes a first switching element including one end connected to the one of the two input terminals, a first diode including a cathode connected to another end of the first switching element and an anode connected to the one of the two output terminals, a second diode including an anode connected to the one of the two input terminals, and a second switching element including one end connected to a cathode of the second diode and another end connected to the one of the two output terminals. The second bidirectional switch includes a third switching element including one end connected to the another one of the two input terminals, a third diode including a cathode connected to another end of the third switching element and an anode connected to the another one of the two output terminals, a fourth diode including an anode connected to the another one of the two input terminals, and a fourth switching element including one end connected to a cathode of the fourth diode and another end connected to the other one of the two output terminals.

In a switching module according to a preferred embodiment of the present invention, when the determiner determines from the first voltage value and the second voltage value, which are obtained from the first time point to when the first testing period elapses, that the first bidirectional switch has a short circuit failure, the determiner avoids determination of whether the first bidirectional switch has a failure at the second time point.

A switching module according to a preferred embodiment of the present invention includes at least one combination of two input terminals, to which AC voltage of a set cycle that is set in advance is applied, and two output terminals, which are connected to a power conversion circuit. The switching module includes, in a combination of the two input terminals and the two output terminals selected from the at least one combination of the two input terminals and the two output terminals, a first bidirectional switch connected in series between one of the two input terminals and one of the two output terminals; a second bidirectional switch connected in series between the another one of the two input terminals and the another one of the two output terminals; an ammeter that detects a current value of a current flowing between the one of the two input terminals and the first bidirectional switch; and a determiner that determines whether the first bidirectional switch has a short circuit failure. The determiner opens the first bidirectional switch and closes the second bidirectional switch from a first time point over a first testing period, which has a length of less than or equal to one-half of the set cycle, to obtain the current value and determine that the first bidirectional switch has a short circuit failure when the obtained current value is greater than or equal to a preset first current threshold value, and when determining from the current value, which is obtained from the first time to when the first testing period elapses, that the first bidirectional switch is functioning normally, the determiner opens the first bidirectional switch and closes the second bidirectional switch from a second time point, which is after a period of less than or equal to n+½ times, where n is a positive integer, the set cycle from the first time point elapses, over a second testing period, which has a length of less than or equal to one-half of the set cycle, to obtain the current value and determine that the first bidirectional switch has a short circuit failure when the obtained current value is greater than or equal to the first current threshold value.

A switching module according to a preferred embodiment of the present invention includes at least one combination of two input terminals, to which AC voltage of a set cycle that is set in advance is applied, and two output terminals, which are connected to a power conversion circuit. The switching module includes, in a combination of the two input terminals and the two output terminals selected from the at least one combination of the two input terminals and the two output terminals, a first bidirectional switch connected in series between one of the two input terminals and one of the two output terminals; a second bidirectional switch connected in series between another one of the two input terminals and another one of the two output terminals; a first voltmeter that detects a first voltage value corresponding to an electric potential difference of an electric potential between the one of the two input terminals and the first bidirectional switch and an electric potential between the another one of the two input terminals and the second bidirectional switch; a second voltmeter that detects a second voltage value corresponding to an electric potential difference of an electric potential between the one of the two output terminals and the first bidirectional switch and an electric potential between the another one of the two output terminals and the second bidirectional switch; and a determiner that determines whether the first bidirectional switch has a short circuit failure. The determiner executes a first determination process that opens the first bidirectional switch and closes the second bidirectional switch from a first time point over a first testing period, which has a length of less than or equal to one-half of the set cycle, obtains the first voltage value and the second voltage value to repetitively determine whether a first differential value of the first voltage value and the second voltage value is less than or equal to a preset first voltage threshold value, and determines that the first bidirectional switch has a short circuit failure when successively determining that the first differential value is less than or equal to the first voltage threshold value for a number of times that is greater than or equal to a preset first number threshold value, and the determiner executes a second determination process that opens the first bidirectional switch and closes the second bidirectional switch from a second time point, which is after a period of n+½ times, where n is a positive integer, the set cycle from the first time point elapses, over a second testing period, which has a length of less than or equal to one-half of the set cycle, obtains the first voltage value and the second voltage value to repetitively determine whether a second differential value of the first voltage value and second voltage value is less than or equal to the first voltage threshold value, and determines that the first bidirectional switch has a short circuit failure when successively determining that the second differential value is less than or equal to the first voltage threshold value for a number of times that is greater than or equal to the first number threshold value.

In a switching module according to a preferred embodiment of the present invention, when the determiner determines in the first determination process that the first bidirectional switch has a short circuit failure, the determiner avoids execution of the second determination process.

In a switching module according to a preferred embodiment of the present invention, the determiner determines that the first bidirectional switch is functioning normally when successively determining in the first determination process that the first differential value is greater than the first voltage threshold value for a number of times that is greater than or equal to a second number threshold value, which is greater than the first number threshold value, and also successively determining in the second determination process that the second differential value is greater than the first voltage threshold value for a number of times that is greater than or equal to the second number threshold value.

In a switching module according to a preferred embodiment of the present invention, in the first determination process, the determiner obtains the first voltage value and the second voltage value to repetitively determine whether the first differential value of the first voltage value and the second voltage value is greater than a second voltage threshold value, which is greater than the first voltage threshold value, and then executes the second determination process when successively determining that the first differential value is greater than the second voltage threshold value for a number of times that is greater than or equal to a third number threshold value that is less than the second number threshold value. In the second determination process, the determiner obtains the first voltage value and the second voltage value to repetitively determine whether the second differential value of the first voltage value and the second voltage value is less than or equal to the second voltage threshold value, and determines that the first bidirectional switch is functioning normally when successively determining that the second differential value is greater than the second voltage threshold value for a number of times that is greater than or equal to the third number threshold value.

A switching module according to a preferred embodiment of the present invention further includes an ammeter that detects a current value of a current flowing between the one of the two input terminals and the one of the output terminals. The determiner increases at least the first number threshold value by a preset number when the current value detected by the ammeter at a time point immediately before the first testing period is less than or equal to a preset second current threshold value.

A switching module according to a preferred embodiment of the present invention further includes an ammeter that detects a current value of a current flowing between the one of the two input terminals and the one of the output terminals. The determiner decreases at least the first number threshold value by a preset number when the current value detected by the ammeter at a time point immediately before the first testing period is greater than a preset third current threshold value.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
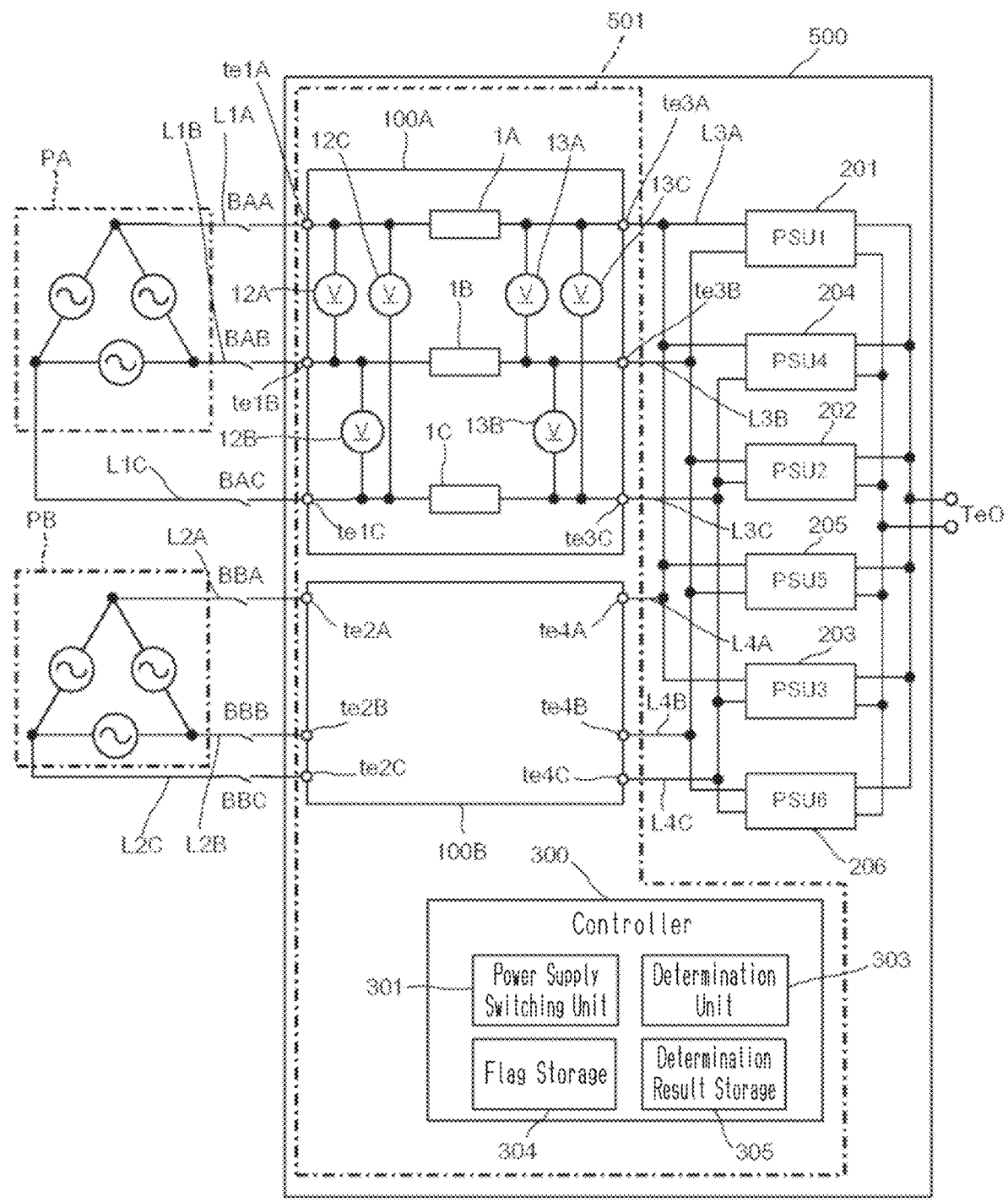
FIG. 1 is a schematic diagram of a power system according to a first preferred embodiment of the present invention.

This description provides a comprehensive explanation of the methods, apparatuses, and/or systems of various preferred embodiments of the present invention. Modifications and equivalents of the methods, apparatuses, and/or systems described herein are included in preferred embodiments of the present invention as should be apparent to one of ordinary skill in the art. Sequences of operations are exemplary, and may be changed as desired or necessary, as should be apparent to one of ordinary skill in the art, with the exception of operations necessarily occurring in a certain order. Descriptions of functions and configurations that are well known to one of ordinary skill in the art may be omitted.

Exemplary preferred embodiments may have different configurations, and are not limited to the examples described. However, the examples described herein are thorough and complete, and convey the full scope of the disclosure to one of ordinary skill in the art.

Throughout the drawings and the detailed description, the same reference numerals refer to the same or corresponding features and elements. The drawings may not be to scale, and the relative size, proportions, and depiction of elements in the drawings may be exaggerated for clarity, illustration, and convenience.

First Preferred Embodiment

A first preferred embodiment of the present invention will now be described with reference to the drawings. A switching module according to the present preferred embodiment is used to control the state of AC power supplied from, for example, a three-phase AC power supply to a load. The switching module includes two input terminals, to which AC voltage of a set cycle that is set in advance is applied, two output terminals, which are connected to a power conversion circuit, a first bidirectional switch, a second bidirectional switch, a first voltmeter, a second voltmeter, and a determiner that determines from the voltage values detected by the first voltmeter and the second voltmeter whether the first bidirectional switch has a short circuit failure. The first bidirectional switch is connected in series between one of the two input terminals and one of the two output terminals, and the second bidirectional switch is connected in series between the other one of the two input terminals and the other one of the two output terminals. The first voltmeter detects a first voltage value corresponding to an electric potential difference of an electric potential between the one of the two input terminals and the first bidirectional switch and an electric potential between the other one of the two input terminals and the second bidirectional switch. The second voltmeter detects a second voltage value corresponding to an electric potential difference of an electric potential between the one of the two output terminals and the first bidirectional switch and an electric potential between the other one of the two output terminals and the second bidirectional switch. The determiner opens the first bidirectional switch and closes the second bidirectional switch from a first time point over a testing period, which is less than or equal to one-half of the set cycle, and determines that the first bidirectional switch has a short circuit failure when a first differential value of the first voltage value and the second voltage value is less than or equal to a preset voltage threshold value. When determining at the first time point that the first bidirectional switch is functioning normally, the determiner opens the first bidirectional switch and closes the second bidirectional switch from a second time point, which is after a period of n+½ times, where n is a positive integer, the set cycle from the first time point elapses, over the testing period (less than or equal to one-half of set cycle), and determines that the first bidirectional switch has a short circuit failure when a second differential value of the first voltage value and the second voltage value is less than or equal to the preset threshold value.

The power system of the present preferred embodiment is an uninterruptible power supply system that supplies power to, for example, a server of a datacenter. FIG. 1 shows an example of a power supply system 500 that receives AC power supplied from a three-phase AC power supply PA or a backup three-phase power supply PB and supplies DC power to a load, such as a server (not shown), for example, that is connected to output terminals TeO. The three-phase AC power supply PA delta-connects three AC power sources and supplies three-phase power current via three power lines L1A, L1B, and L1C to the power supply system 500. The three-phase power supply PB delta-connects three AC power sources and supplies three-phase current via three power lines L2A, L2B, and L2C to the power supply system 500. The power lines L1A, L1B, L1C, L2A, L2B, and L2C are connected to breakers BAA, BAB, BAC, BBA, BBB, and BBC, respectively.

Figure 2:
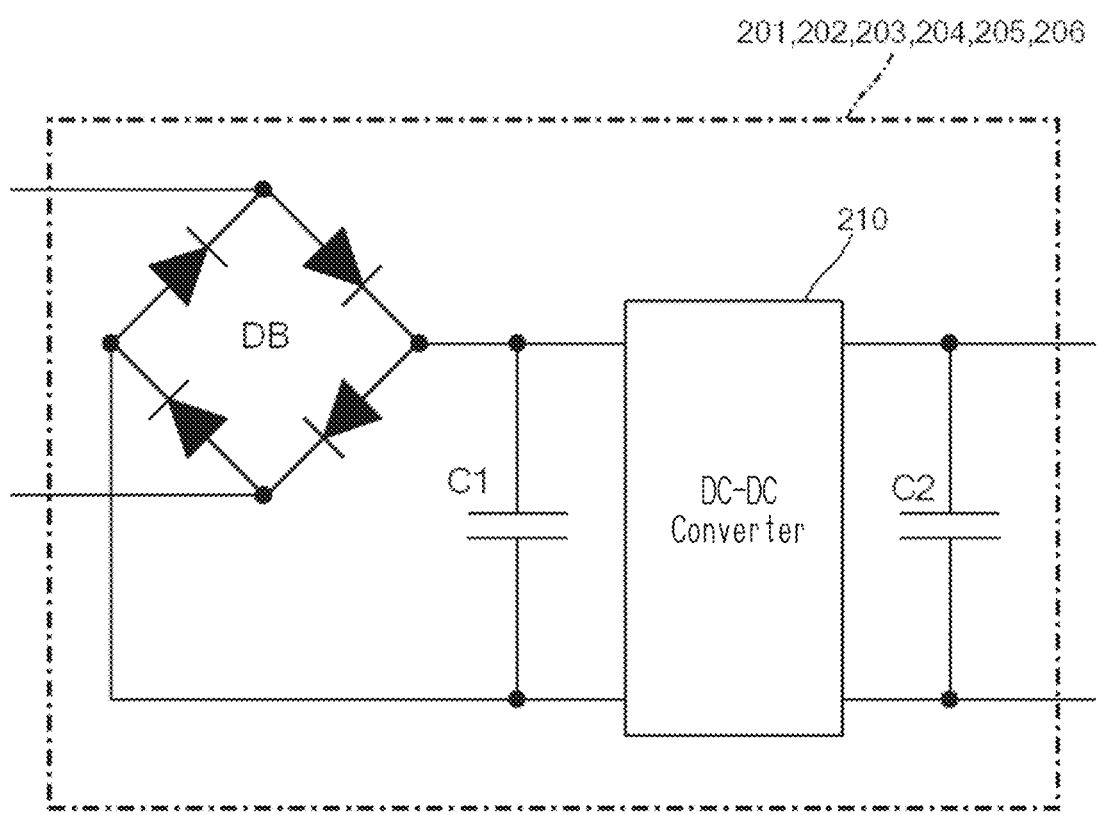
FIG. 2 is a circuit diagram of a power converter in the first preferred embodiment of the present invention.

The power supply system 500 includes two module main bodies 100A and 100B, six power conversion circuits 201, 202, 203, 204, 205, and 206, and a controller 300 that controls operation of these elements. The module main bodies 100A and 100B and the controller 300 define a switching module 501. As shown in FIG. 2, the power conversion circuits 201, 202, 203, 204, 205, and 206 each include, for example, a rectification circuit DB, a smoothing capacitor C1 connected between output terminals of the rectification circuit DB, a DC-DC converter 210 that increases or decreases the DC voltage produced between the two terminals of the capacitor C1 and outputs the DC voltage, and a ripple current reducing capacitor C2 connected between output terminals of the DC-DC converter 210. The DC-DC converter 210 includes, for example, an inductor, a switching element, and a drive circuit that controls the switching element. Based on instruction value information indicating an instruction value of output voltage from the controller 300, the drive circuit outputs a Pulse Width Modulation (PWM) signal or a Pulse Frequency Modulation (PFM) signal to the switching element to control the output of the DC-DC converter 210. The output terminals of the DC-DC converter 210 are connected to the two output terminals TeO of the power supply system 500.

As shown in FIG. 1, the module main body 100A includes input terminals te1A, te1B, and te1C and output terminals te3A, te3B, and te3C. The input terminals te1A, te1B, and te1C are respectively connected to the power lines L1A, L1B, and L1C, which are connected to the three-phase AC power supply PA. The output terminals te3A, te3B, and te3C are connected to the power lines L3A, L3B, and L3C, which are connected to the power conversion circuits 201, 202, 203, 204, 205, and 206. The module main body 100B includes input terminals te2A, te2B, and te2C and output terminals te4A, te4B, and te4C. The input terminals te2A, te2B, and te2C are respectively connected to the power lines L2A, L2B, and L2C, which are connected to the backup three-phase power supply PB. The output terminals te4A, te4B, and te4C are connected to the power lines L4A, L4B, and L4C, which are connected to the power conversion circuits 201, 202, 203, 204, 205, and 206. The module main body 100A includes three bidirectional switches 1A, 1B, and 1C and six voltmeters 12A, 12B, 12C, 13A, 13B, and 13C. The module main body 100B has the same or substantially the same configuration as the module main body 100A and includes three bidirectional switches (not shown) and six voltmeters (not shown).

Figure 3:
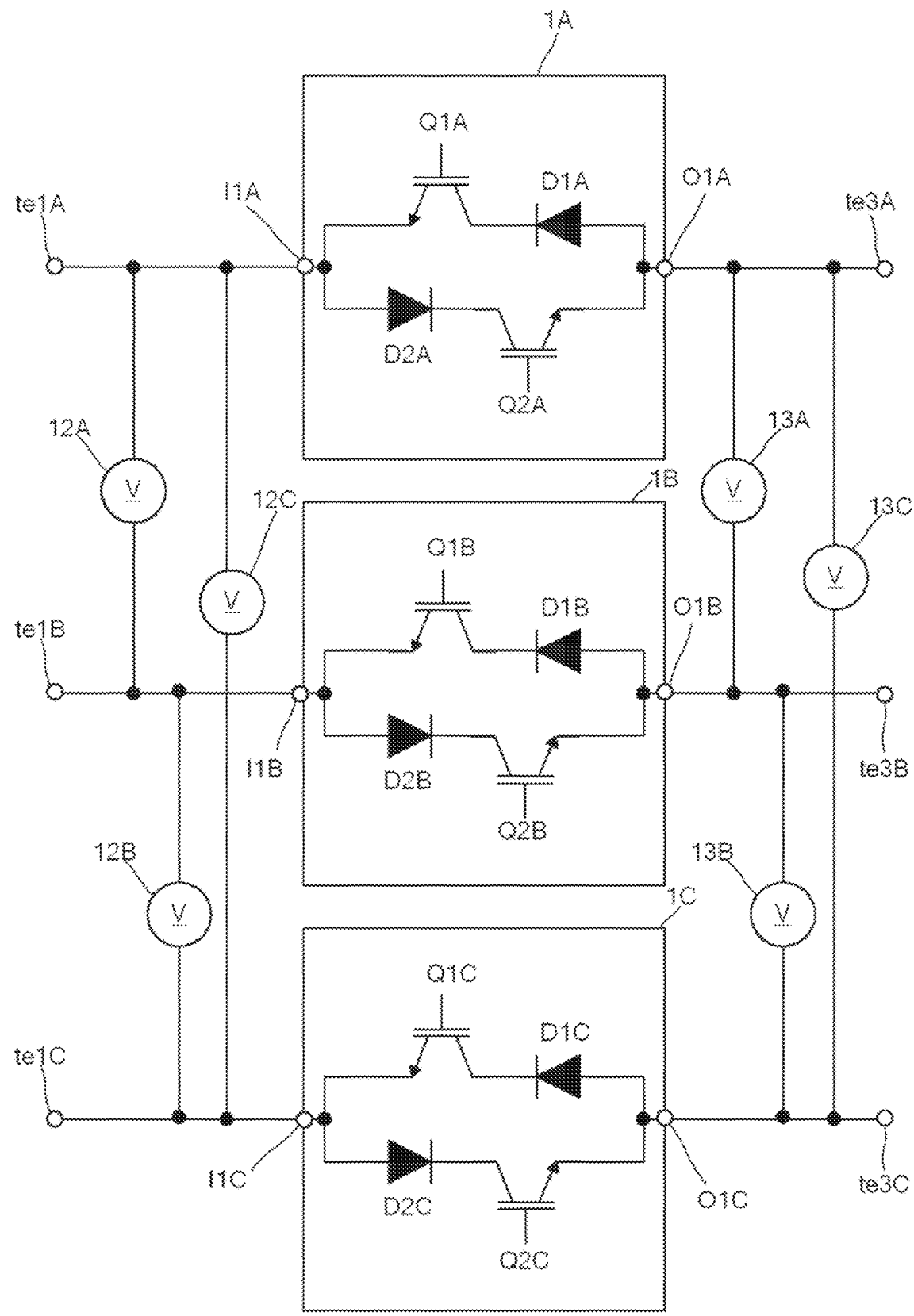
FIG. 3 is a circuit diagram of a module body in the first preferred embodiment of the present invention.

The bidirectional switch 1A is connected in series between the input terminal te1A and the output terminal te3A. The bidirectional switch 1B is connected in series between the input terminal te1B and the output terminal te3B. The bidirectional switch 1C is connected in series between the input terminal te1C and the output terminal te3C. As shown in FIG. 3, the bidirectional switch 1A includes two switching elements Q1A and Q2A and two diodes D1A and D2A. Each of the switching elements Q1A and Q2A includes, for example, an Insulated Gate Bipolar Transistor (IGBT). The switching element Q1A includes one end connected to the input terminal te1A. The diode D1A includes a cathode connected to another end of the switching element Q1A and an anode connected to the output terminal te3A. The diode D2A includes an anode connected to the input terminal te1A. The switching element Q2A includes one end connected to a cathode of the diode D2A and another end connected to the output terminal te3A. The bidirectional switch 1B includes two switching elements Q1B and Q2B and the two diodes D1B and D2B. The switching element Q1B includes one end connected to the input terminal te1B. The diode D1B includes a cathode connected to another end of the switching element Q1B and an anode connected to the output terminal te3B. The diode D2B includes an anode connected to the input terminal te1B. The switching element Q2B includes one end connected to a cathode of the diode D2B and another end connected to the output terminal te3B. The bidirectional switch 1C includes two switching elements Q1C and Q2C and the two diodes D1C and D2C. The switching element Q1C includes one end connected to the input terminal te1C. The diode D1C includes a cathode connected to another end of the switching element Q1C and an anode connected to the output terminal te3C. The diode D2C includes an anode connected to the input terminal te1C. The switching element Q2C includes one end connected to a cathode of the diode D2C and another end connected to the output terminal te3C.

The voltmeter 12A is connected between input terminals I1A and I1B of the bidirectional switches 1A and 1B, and the voltmeter 12B is connected between input terminals I1B and I1C of the bidirectional switches 1B and 1C. The voltmeter 12C is connected between input terminals I1A and I1C of the bidirectional switches 1A and 1C. The voltmeter 12A detects a voltage value corresponding to an electric potential difference between an electric potential between the input terminal te1A and the bidirectional switch 1A and an electric potential between the input terminal te1B and the bidirectional switch 1B. The voltmeter 12B detects a voltage value corresponding to an electric potential difference between an electric potential between the input terminal te1B and the bidirectional switch 1B and an electric potential between the input terminal te1C and the bidirectional switch 1C. The voltmeter 12C detects a voltage value corresponding to an electric potential difference between an electric potential between the input terminal te1A and the bidirectional switch 1A and an electric potential between the input terminal te1C and the bidirectional switch 1C.

The voltmeter 13A is connected between output terminals O1A and O1B of the bidirectional switches 1A and 1B, and the voltmeter 13B is connected between output terminals O1B and O1C of the bidirectional switches 1B and 1C. The voltmeter 13C is connected between output terminals O1A and O1C of the bidirectional switches 1A and 1C. The voltmeter 13A detects a voltage value corresponding to an electric potential difference between an electric potential between the output terminal te3A and the bidirectional switch 1A and an electric potential between the output terminal te3B and the bidirectional switch 1B. The voltmeter 13B detects a voltage value corresponding to an electric potential difference between an electric potential between the output terminal te3B and the bidirectional switch 1B and an electric potential between the output terminal te3C and the bidirectional switch 1C. the voltmeter 13C detects a voltage value corresponding to an electric potential difference between an electric potential between the output terminal te3A and the bidirectional switch 1A and an electric potential between the output terminal te3C and the bidirectional switch 1C.

Referring to FIG. 1, the controller 300, which includes, for example, a microcomputer and a memory, controls the operation of the module main bodies 100A and 100B. The controller 300 is configured or programmed to include a power supply switch 301 and a determiner 303. Further, the controller 300 is configured or programmed to include a counter (not shown) that counts the number of times that the determiner 303 repetitively obtains voltage values from the voltmeters 12A, 12B, 12C, 13A, 13B, and 13C. The switching module 501 may include the module main bodies 100A and 100B together with the controller 300 in the same package or include the module main bodies 100A and 100B separately from the controller 300 in different packages. Alternatively, the module main bodies 100A and 100B may be included together with the determiner 303 and the memory of the controller 300 in the same package, and the power supply switch 301 of the controller 300 may be included in a separate package. As another option, the module main bodies 100A and 100B may be included together with the power supply switch 301 and the memory of the controller 300 in the same package, and the determiner 303 of the controller 300 may be included in a separate package.

The memory includes flag storage 304 and determination result storage 305 that stores determination result information indicating the determination results of the determiner 303 of whether the bidirectional switches 1A, 1B, and 1C have short circuit failures. The flag storage 304 stores a completion flag, which indicates whether the determination of whether each of the bidirectional switches 1A, 1B, and 1C includes a failure has been completed, and a determination end flag, which will be described later. Further, the memory stores information indicating the upper limit value for the number of times that the determiner 303 repetitively obtains voltage values from the voltmeters 12A, 12B, 12C, 13A, 13B, and 13C.

When setting the source of the power supplied to the power supply system 500 to the three-phase AC power supply PA, the power supply switch 301 outputs control signals to the module main bodies 100A and 100B to close the three bidirectional switches 1A, 1B, and 1C of the module main body 100A and open the three bidirectional switches (not shown) of the module main body 100B. When setting the source of the power supplied to the power supply system 500 to the backup three-phase power supply PB, the power supply switch 301 outputs control signals to the module main bodies 100A and 100B to open the three bidirectional switches 1A, 1B, and 1C of the module main body 100A and close the three bidirectional switches (not shown) of the module main body 100B. The power supply switch 301 outputs control signals to the gate terminals of the switching elements Q1A, Q2A, Q1B, Q2B, Q1C, and Q2C to turn on or turn off the switching elements Q1A, Q2A, Q1B, Q2B, Q1C, and Q2C.

Figure 4:
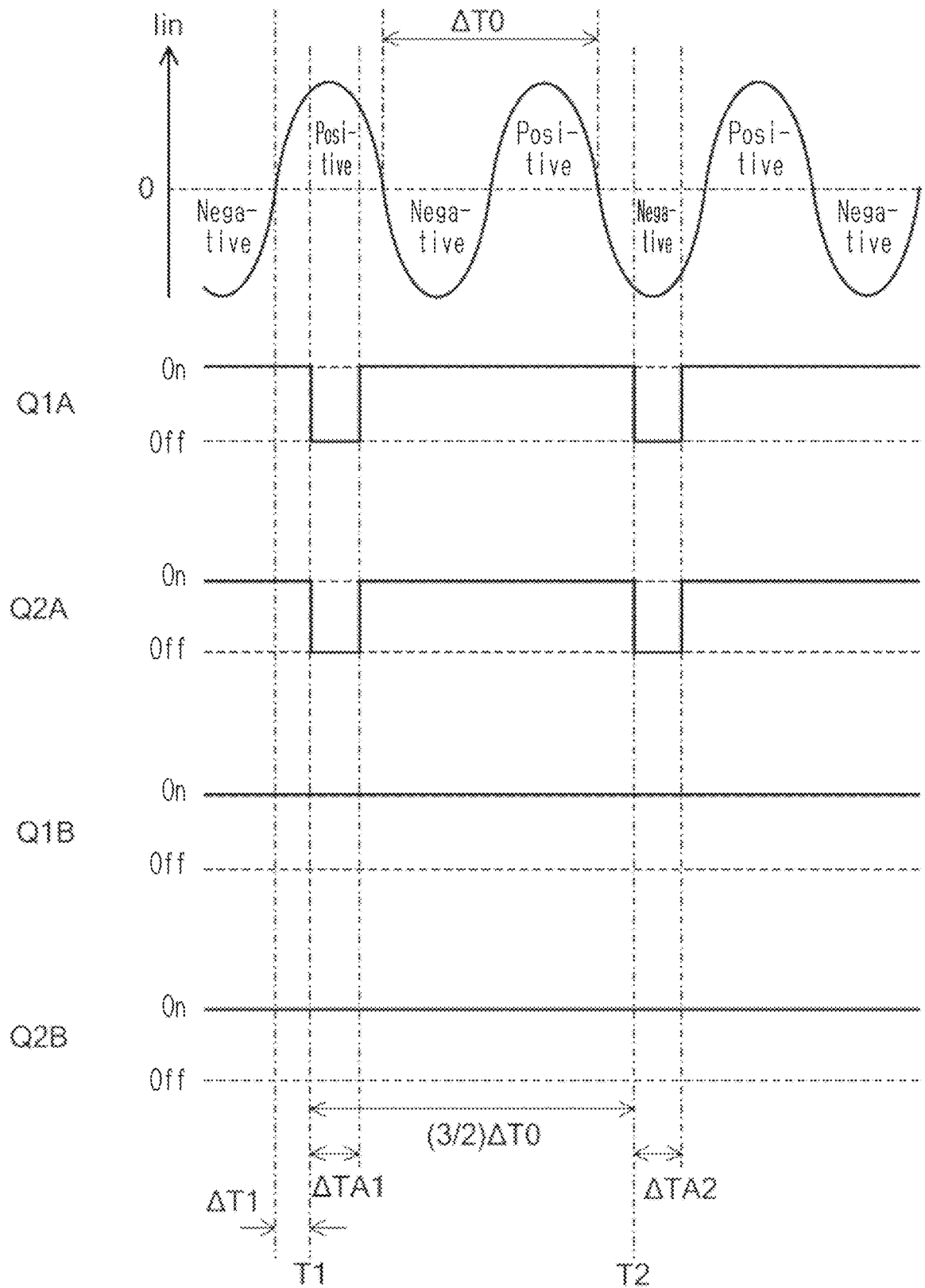
FIG. 4 is a time chart illustrating the operation of a switching module in the first preferred embodiment of the present invention.
Figure 5A:
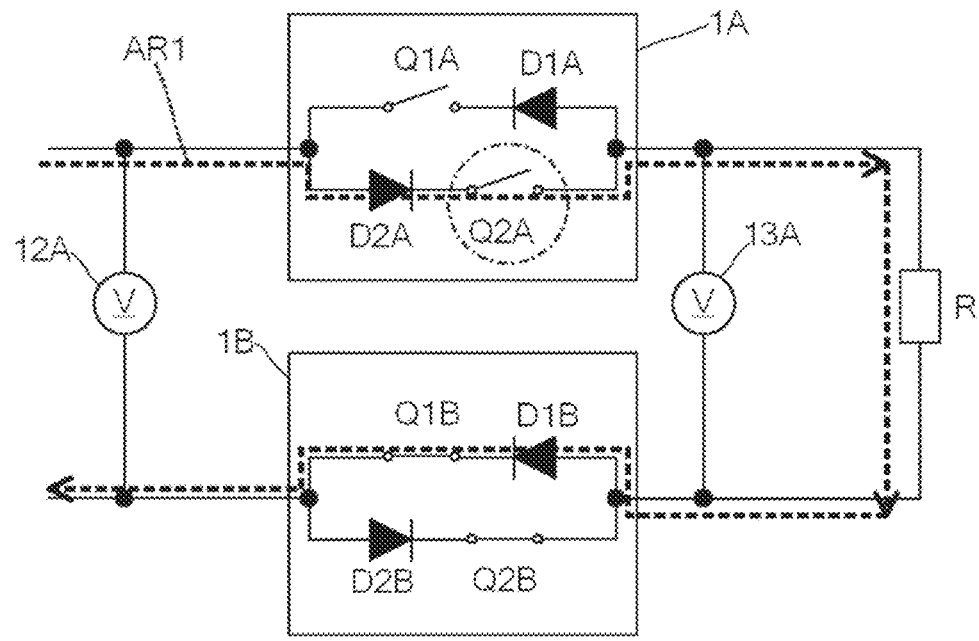
FIG. 5A is a circuit diagram illustrating a state in which one of two switching elements in the module body of the first preferred embodiment of the present invention has a short circuit failure.

The determiner 303 executes a short circuit determination process to determine whether the bidirectional switches 1A, 1B, and 1C have short circuit failures. An example of a case in which the determiner 303 determines whether the bidirectional switch 1A has a failure will now be described. As shown in FIG. 4, the determiner 303 first turns off the switching elements Q1A and Q2A and turns on the switching elements Q1B and Q2B from a first time point T1 over testing period (first testing period) $\Delta TA1$, which has a length of less than or equal to one-half of a set cycle T0 that is set in advance of the AC current supplied from the three-phase AC power supply PA. More specifically, the determiner 303 opens the bidirectional switch 1A and closes the bidirectional switch 1B during testing period $\Delta TA1$ that is included in a period during which the polarity of the AC current Iin is positive. The first time point T1 is, for example, the time point at which period $\Delta T1$ from time point T0 elapses. Time point T0 corresponds to the zero crossing point of the input current. The length of testing period $\Delta TA$ is set to, for example, about 0.3 times or greater and about 0.5 times or less than the set cycle T0 of the AC current supplied from the three-phase AC power supplies PA and PB. The length of testing period $\Delta TA$ may be determined based on, for example, the discharge time constant of the capacitor C1 that is determined by the size of the capacitor C1 in each of the power conversion circuits 201, 202, 203, 204, 205, and 206 and the size of the load connected to each of the power conversion circuits 201, 202, 203, 204, 205, and 206. The discharge time constant indicates the period during which the capacitor C1 discharges power to the load. The power from the AC power supply to the load that decreases when the switching elements Q1A and Q2A are turned off during the testing period $\Delta TA$ is compensated for by the discharge from the capacitor C1 to the load. Such control is performed to minimize decreases in the power supplied to the load from the AC power when checking for short circuit failures. A larger time constant allows for a longer testing period $\Delta TA$ to be set. When the testing period $\Delta TA1$ is set to be equal to about 0.5 times the set cycle T0 of the AC current supplied from the three-phase AC power supplies PA and PB, the voltmeters 12A, 12B, 12C, 13A, 13B, and 13C may send zero crossing point detection information to the controller 300 when detecting a zero crossing point of the input current. Based on the zero crossing point detection information received from the voltmeters 12A, 12B, 12C, 13A, 13B, and 13C, the determiner 303 may specify voltage values detected between two zero crossing points that are adjacent to each other in a timeline during the testing period $\Delta TA1$. When the differential absolute value (first differential value) of the voltage value (first voltage value) detected by the voltmeter 12A and the voltage value (second voltage value) detected by the voltmeter 13A is less than or equal to a preset first voltage threshold value, the determiner 303 determines that the bidirectional switch 1A has a short circuit failure. For example, as shown in FIG. 5A, when the switching element Q2A corresponding to a second switching element of the bidirectional switch 1A has a short circuit failure, current flows as shown by the arrowed broken line AR1. Thus, the voltage value detected by the voltmeter 12A is the same or substantially the same as the voltage value detected by the voltmeter 13A. The differential absolute value of the voltage values detected by the voltmeter 12A and the voltmeter 13A is close to zero. Thus, a short circuit failure may be determined by setting the first voltage threshold value to a value that is close to zero.

When the switching element Q2A does not have a short circuit failure, the switching element Q2A is open. Thus, the voltage value detected by the voltmeter 12A differs from the voltage value detected by the voltmeter 13A. Accordingly, when the differential absolute value of the voltage values detected by the voltmeter 12A and the voltmeter 13A is greater than the first voltage threshold value, it may be determined that there is no short circuit failure.

Figure 5B:
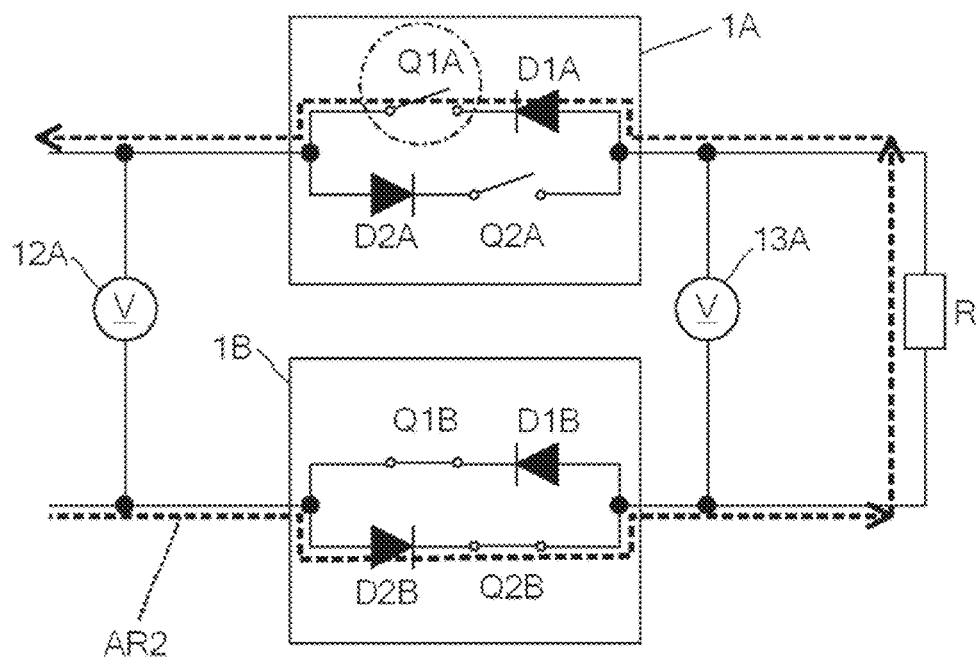
FIG. 5B is a circuit diagram illustrating a state in which the other one of two switching elements in the module body of the first preferred embodiment of the present invention has a short circuit failure.

The determiner 303 may determine that the bidirectional switch 1A is functioning normally based on the voltage values obtained from the first time point T1 to when the testing period ΔTA elapses. In this case, the determiner 303, for example, turns on the switching elements Q1A, Q2A, Q1B, and Q2B and charges the capacitor C1 from the first time point T1 to when a period of n+½ times, where n is a positive integer, for example, N=1 in the description of the present preferred embodiment, the set cycle T0, which is preset, elapses. Then, as shown in FIG. 4, the determiner 303 performs a second test from a second time point T2 after period ΔT0 1+½, which is 1+½ times the set cycle T0, elapses from the first time point T1. In a second testing period ΔTA2, the switching elements Q1A and Q2A are turned off and the switching elements Q1B and Q2B are turned on. The power from the AC power supply to the load that decreases during the second testing period ΔTA2 is compensated for by the discharge from the capacitor C1 to the load. The determiner 303 opens the bidirectional switch 1A and closes the bidirectional switch 1B during the testing period ΔTA2 that is included in a period during which the polarity of the AC current Iin is negative. The length of the testing period ΔTA2 is also set to, for example, about 0.3 times or greater and about 0.5 times or less than the set cycle T0 of the AC current supplied from the three-phase AC power supplies PA and PB. The length of the testing period ΔTA2 may be the same as or differ from the length of the testing period ΔTA1. When the differential absolute value (second differential value) of the voltage value (first voltage value) detected by the voltmeter 12A and the voltage value (second voltage value) detected by the voltmeter 13A is less than or equal to the first voltage threshold value, the determiner 303 determines that the bidirectional switch 1A has a short circuit failure. For example, as shown in FIG. 5B, when the switching element Q1A corresponding to a first switching element of the bidirectional switch 1A has a short circuit failure, current flows as shown by the arrowed broken line AR2. Thus, the differential absolute value of the voltage value detected by the voltmeter 12A and the voltage value detected by the voltmeter 13A is less than or equal to the first voltage threshold value.

When the determination of whether the bidirectional switch 1A (1B, 1C) has a failure ends, which is based on the voltage values obtained from the first time point T1 to when the testing period ΔTA1 elapses, the determination end flag is indicated as "on." The determination end flag is indicated as "off" when determined that the bidirectional switch 1A (1B, 1C) has a failure or when the determination of whether the bidirectional switch 1A (1B, 1C) has a failure ends, which is based on the voltage values obtained from the second time point T2 to when the testing period ΔTA2 elapses.

The time from when the determiner 303 obtains the voltage values with the voltmeters 12A, 12B, 12C, 13A, 13B, and 13C to when the determination of whether there is a failure ends is in accordance with the processing speed of the controller 300 and is, for example, about 125 psec.

The bidirectional switch 1A corresponds to the first bidirectional switch, the bidirectional switch 1B corresponds to the second bidirectional switch, the voltmeter 12A corresponds to the first voltmeter, and the voltmeter 13A corresponds to the second voltmeter. The switching element Q1A corresponds to the first switching element, and the switching element Q2A corresponds to the second switching element. The switching element Q1B corresponds to the third switching element, and the switching element Q2B corresponds to the fourth switching element. The diode D1A corresponds to the first diode, and the diode D2A corresponds to the second diode. The diode D1B corresponds to the third diode, and the diode D2B corresponds to the fourth diode. The claims are not limited to the present preferred embodiment.

Figure 6:
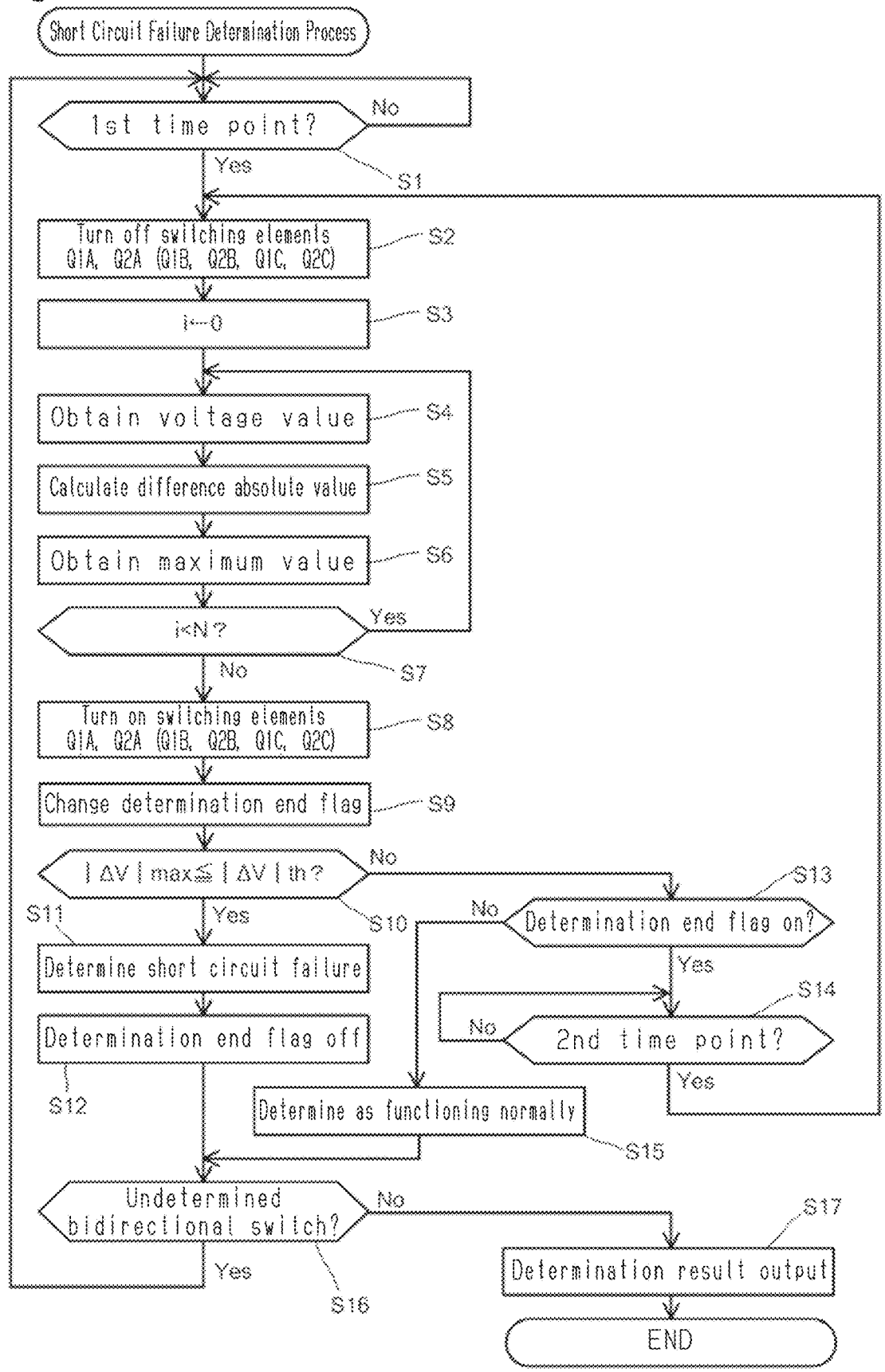
FIG. 6 is a flowchart illustrating a short circuit failure determination process executed by a determiner in the first preferred embodiment of the present invention.

The short circuit determination process executed by the determiner 303 of the present preferred embodiment will now be described with reference to FIGS. 6 and 7. The bidirectional switches 1A, 1B, and 1C of the module main body 100A are all closed when the short circuit failure determination process starts. Further, for one of the bidirectional switches 1A (1B, 1C) that is the subject of determination, the determination end flag, which indicates whether the short circuit failure determination has ended, is set to a state indicating off with the bidirectional switch 1A (1B, 1C) turned off during the testing period from the first time point. As shown in FIG. 6, in step S1, the determiner 303 determines whether it is the first time point. As long as the first time point has not been reached (step S1: No), the determiner 303 repeats step S1. When the determiner 303 determines that it is the first time point (step S1: Yes), the determiner 303 turns off the switching elements Q1A and Q2A (Q1B, Q2B, Q1C, Q2C) in step S2. When determining whether the bidirectional switch 1A has a short circuit failure, the determiner 303 turns off the switching elements Q1A and Q2A. When determining whether the bidirectional switch 1B has a short circuit failure, the determiner 303 turns off the switching elements Q1B and Q2B. When determining whether the bidirectional switch 1C has a short circuit failure, the determiner 303 turns off the switching elements Q1C and Q2C.

In step S3, a count value i indicating the number of times that voltage values have been obtained from the voltmeters 12A and 13A (12B, 13B, 12C, 13C) is set to 0. In step S4, the determiner 303 obtains a voltage value from each of the voltmeters 12A and 13A (12B, 13B, 12C, 13C). when determining whether the bidirectional switch 1A has a short circuit failure, the determiner 303 obtains a voltage value from each of the voltmeters 12A and 13A. When determining whether the bidirectional switch 1B has a short circuit failure, the determiner 303 obtains a voltage value from each of the voltmeters 12B and 13B. When determining whether the bidirectional switch 1C has a short circuit failure, the determiner 303 obtains a voltage value from each of the voltmeters 12C and 13C.

In step S5, the determiner 303 calculates a differential absolute value |ΔV| of the two obtained voltage values. In step S6, when the voltage values have been repetitively obtained from the voltmeters 12A and 13A (12B, 13B, 12C, 13C) for an i number of times, the determiner 303 obtains the maximum value of the i number of differential absolute values. In step S7, the determiner 303 determines whether the count value i is less than a preset upper limit value N for the repeated number of times. The upper limit value N for the repeated number of times is set to, for example, 9. When the determiner 303 determines that the count value i is less than the upper limit value N (step S7: Yes), the determiner 303 performs step S4 again.

When the determiner 303 determines that the count value i is greater than or equal to the upper limit value N (step S7: No), the determiner 303 proceeds to step S8 and turns on the switching elements Q1A and Q2A (Q1B, Q2B, Q1C, Q2C). Further, the determiner 303 initializes the counter value of the counter to 0. In step S9, the determiner 303 changes the determination end flag stored in the flag storage 304. In this case, if the determination end flag had been set to on, the determiner 303 changes the determination end flag to off. If the determination end flag had been set to off, the determiner 303 sets the determination end flag to on.

In step S10, the determiner 303 determines whether the maximum differential absolute value |ΔV|max is less than or equal to a preset first voltage threshold value |ΔV|th. When the determiner 303 determines that the maximum differential absolute value |ΔV|max is less than or equal to the first voltage threshold value |ΔV|th (step S10: Yes), the determiner 303 proceeds to step S11 and determines that the bidirectional switch 1A (1B, 1C) has a short circuit failure. In this case, the determiner 303 stores failure determination information, which indicates that the bidirectional switch 1A (1B, 1C) has a short circuit failure, in association with identification information of the bidirectional switch 1A (1B, 1C), which is the subject of determination, in the determination result storage 305. In step S12, the determiner 303 sets the determination end flag, which is stored in the flag storage 304, to off. In this case, if the determination end flag stored in the flag storage 304 had already been set to off, the determiner 303 maintains the off state of the determination end flag. Then, the determiner 303 proceeds to step S16, which will be described later.

When the determiner 303 determines in step S10 that the maximum differential absolute value |ΔV|max is greater than the first voltage threshold value |ΔV|th (step S10: No), the determiner 303 proceeds to step S13 and determines whether the determination end flag is on. When the determiner 303 determines that the determination end flag is on (step S13: Yes), the determiner 303 proceeds to step S14 and determines whether it is the second time point. As long as the second time point has not been reached (step S14: No), the determiner 303 repeats step S14. When the determiner 303 determines that it is the second time point (step S14: Yes), the determiner 303 performs the processes from step S2 again.

When the determiner 303 determines in step S13 that the determination end flag is off (step S13: No), the determiner 303 proceeds to step S15 and determines that the bidirectional switch 1A (1B, 1C) is functioning normally. In this case, the determiner 303 stores normality determination information, which indicates that the bidirectional switch 1A (1B, 1C) is functioning normally, in association with the identification information of the bidirectional switch 1A (1B, 1C), which is the subject of determination, in the determination result storage 305.

In step S16, the determiner 303 determines whether short circuit failure is undetermined for any one of the bidirectional switches 1A, 1B, and 1C from the completion flag stored in the flag storage 304. When the determiner 303 determines that short circuit failure is undetermined for any one of the bidirectional switches 1A, 1B, and 1C (step S16: Yes), the determiner 303 performs the processes from step S1 on the undetermined bidirectional switch 1A (1B, 1C). When the determiner 303 determines that there is no bidirectional switch 1A (1B, 1C) for which short circuit failure is undetermined (step S16: No), the determiner 303 proceeds to step S17 and outputs the determination result information stored in the determination result storage 305 to an external device (not shown). Then, the determiner 303 ends the short circuit failure determination process.

Figure 7:
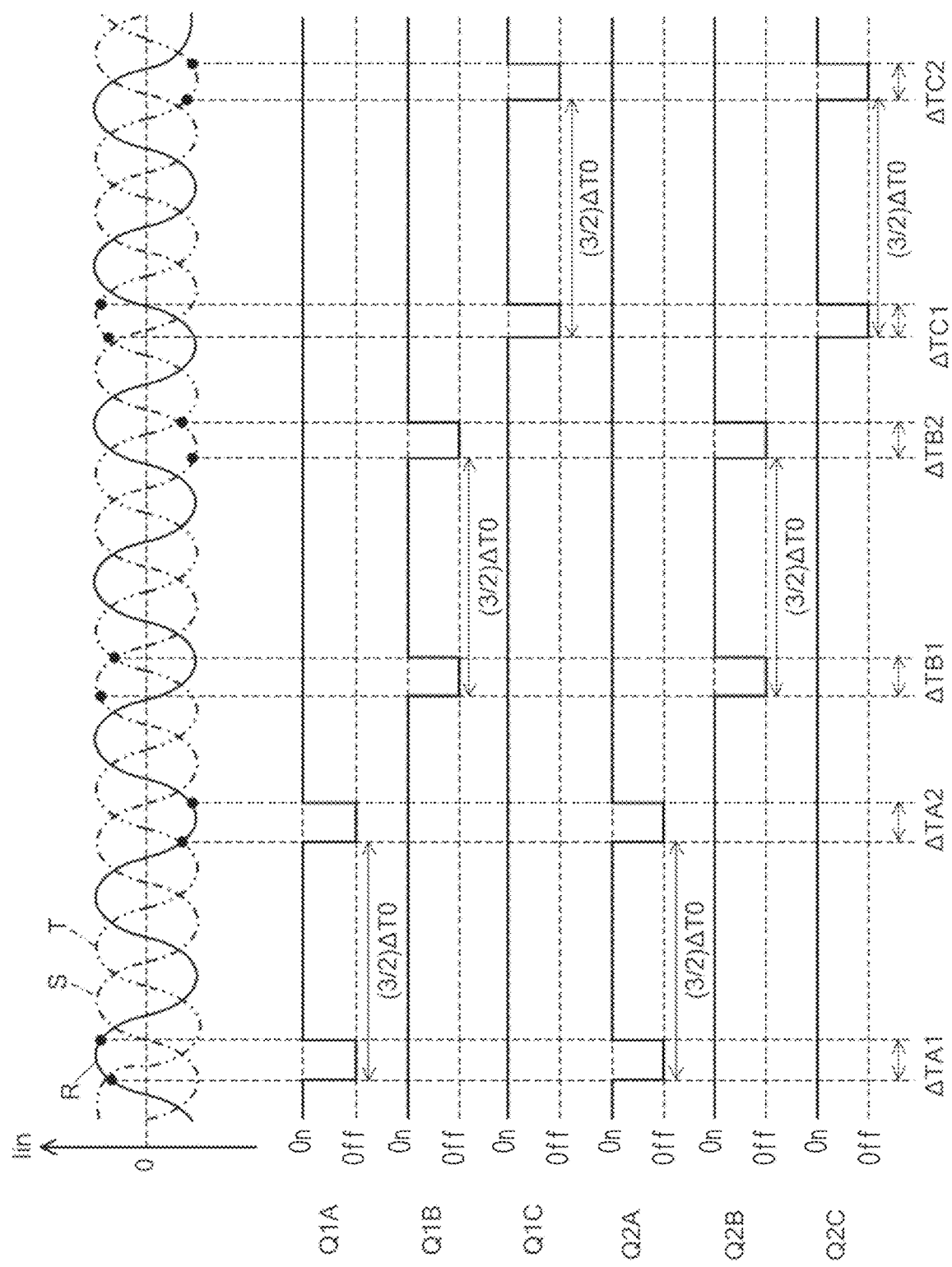
FIG. 7 is a time chart illustrating the operation of the switching module in the first preferred embodiment of the present invention.

As shown in the example illustrated in FIG. 7, the determiner 303 executes the short circuit failure determination process to switch on and off the switching elements Q1A, Q1B, Q1C, Q2A, Q2B, and Q2C of the bidirectional switches 1A, 1B, and 1C. More specifically, the determiner 303 first turns off the switching elements Q1A and Q2A of the bidirectional switch 1A when the polarity of the R-phase AC current flowing through the power line L1A is positive in period ΔTA1 and negative in period ΔTA2 to determine whether the bidirectional switch 1A has a short circuit failure. Then, the determiner 303 turns off the switching elements Q1B and Q2B of the bidirectional switch 1B when the polarity of the S-phase AC current flowing through the power line L1B is positive in period ΔTB1 and negative in period ΔTB2 to determine whether the bidirectional switch 1B has a short circuit failure. Afterwards, the determiner 303 turns off the switching elements Q1C and Q2C of the bidirectional switch 1C when the polarity of the T-phase AC current flowing through the power line L1C is positive in period ΔTC1 and negative in period ΔTC2 to determine whether the bidirectional switch 1C has a short circuit failure.

As described above, with the switching module 501 in accordance with the present preferred embodiment, the determiner 303 opens one of the bidirectional switches 1A, 1B, and 1C and closes another one of the bidirectional switches 1A, 1B, and 1C from a first time period over a testing period, which has a length of less than or equal to one-half of the set cycle that is determined in advance, to obtain voltages values at two sides of each of the bidirectional switches 1A, 1B, and 1C and determine that the one of the bidirectional switches 1A, 1B, and 1C that is open has a short circuit failure if the differential absolute value of the two obtained voltage values is less than or equal to the first voltage threshold value. Further, when the determiner 303 determines from the voltage values obtained from the first time point to when the testing period elapses that the bidirectional switches 1A, 1B, and 1C are functioning normally, the determiner 303 opens one of the bidirectional switches 1A, 1B, and 1C and closes another one of the bidirectional switches 1A, 1B, and 1C from a second time point, which is after a period of n+½ times, where n is a positive integer, the set cycle from the first time point elapses, over a testing period to obtain voltage values at the two sides of each of the bidirectional switches 1A, 1B, and 1C and determine that the one of the bidirectional switches 1A, 1B, and 1C that is open has a short circuit failure if the differential absolute value of the two obtained voltage values is less than or equal to the first voltage threshold value. Thus, short circuit failure of the bidirectional switches 1A, 1B, and 1C can be determined by merely opening the bidirectional switches 1A, 1B, and 1C during the testing period, which has a length of less than or equal to one-half of the set cycle of the AC current supplied from the three-phase AC power supplies PA and PB, or by repeating these actions again after a period of n+½ times, where n is a positive integer, the set cycle elapses after the actions are first performed. This enables determination of whether the bidirectional switches 1A, 1B, and 1C have short circuit failures without decreasing the power supplied from the three-phase AC power supplies PA and PB to the load.

Further, with the switching module 501 in accordance with the present preferred embodiment, the voltmeter 12A is connected between the input terminals I1A and I1B of the bidirectional switches 1A and 1B, and the voltmeter 12B is connected between the input terminals I1B and I1C of the bidirectional switches 1B and 1C. The voltmeter 12C is connected between the input terminals I1A and I1C of the bidirectional switches 1A and 1C. The voltmeter 13A is connected between the output terminals O1A and O1B of the bidirectional switches 1A and 1B, and the voltmeter 13B is connected between the output terminals O1B and O1C of the bidirectional switches 1B and 1C. The voltmeter 13C is connected between the output terminals O1A and O1C of the bidirectional switches 1A and 1C. Thus, the wiring length is shortened between the bidirectional switches 1A, 1B, and 1C and the voltmeters 12A, 12B, 12C, 13A, 13B, and 13C. This decreases the parasitic impedance produced in the wiring and increases the accuracy of the voltage values detected by the voltmeters 12A, 12B, 12C, 13A, 13B, and 13C. Thus, the accuracy of the short circuit failure determination performed on the bidirectional switches 1A, 1B, and 1C is increased.

Further, in the switching module 501 in accordance with the present preferred embodiment, the lengths of the testing periods are set to, for example, about 0.3 times or greater and about 0.5 times or less than the set cycle of the AC current supplied from the three-phase AC power supplies PA and PB. The testing period that is about 0.3 times or greater and about 0.5 times or less than the set cycle allows for an increase in the number of counts. This improves the accuracy for determining whether the bidirectional switches 1A, 1B, and 1C have a short circuit failure. The testing period is, for example, about 0.3 times the set cycle. Further, the time from when the determiner 303 obtains the voltage value from the voltmeters 12A, 12B, 12C, 13A, 13B, and 13C to when the determiner 303 completes the determination of whether there is a short circuit failure is, for example, about 125 psec. In this case, the determiner 303 can repeat the determination at least 40 times, for example. This ensures sufficient determination accuracy.

Moreover, when the determiner 303 in accordance with the present preferred embodiment determines from the first time point to when the testing period elapses that the bidirectional switches 1A, 1B, and 1C have short circuiting failures based on the voltage values obtained at the two ends of each of the bidirectional switches 1A, 1B, and 1C, the determiner 303 avoids the determination of whether the bidirectional switches 1A, 1B, and 1C have a short circuit failure at the second time point. This shortens the period during which the bidirectional switches 1A, 1B, and 1C are open and minimizes decreases in the output of the power supply system 500.

Second Preferred Embodiment

Similarly to the switching module of the first preferred embodiment, a switching module according to a second preferred embodiment of the present invention includes two input terminals, two output terminals, a first bidirectional switch, a second bidirectional switch, a first voltmeter, and a second voltmeter. The second preferred embodiment differs from the first preferred embodiment in that the determiner opens the first bidirectional switch and closes the second bidirectional switch from a first time point over a testing period, which is less than or equal to one-half of a set cycle, and determines that the first bidirectional switch has a short circuit failure when a first differential value of the first voltage value and the second voltage value is less than or equal to a preset first voltage threshold value. Further, the second preferred embodiment differs from the first preferred embodiment in that when determining at the first time point that the first bidirectional switch is functioning normally, the determiner opens the first bidirectional switch and closes the second bidirectional switch from a second time point, which is after a period of n+½ times, where n is a positive integer, the set cycle from the first time point elapses, over the testing period (less than or equal to one-half of set cycle), and determines that the first bidirectional switch has a short circuit failure when a second differential value of the first voltage value and the second voltage value is less than or equal to the first voltage threshold value.

Figure 8:
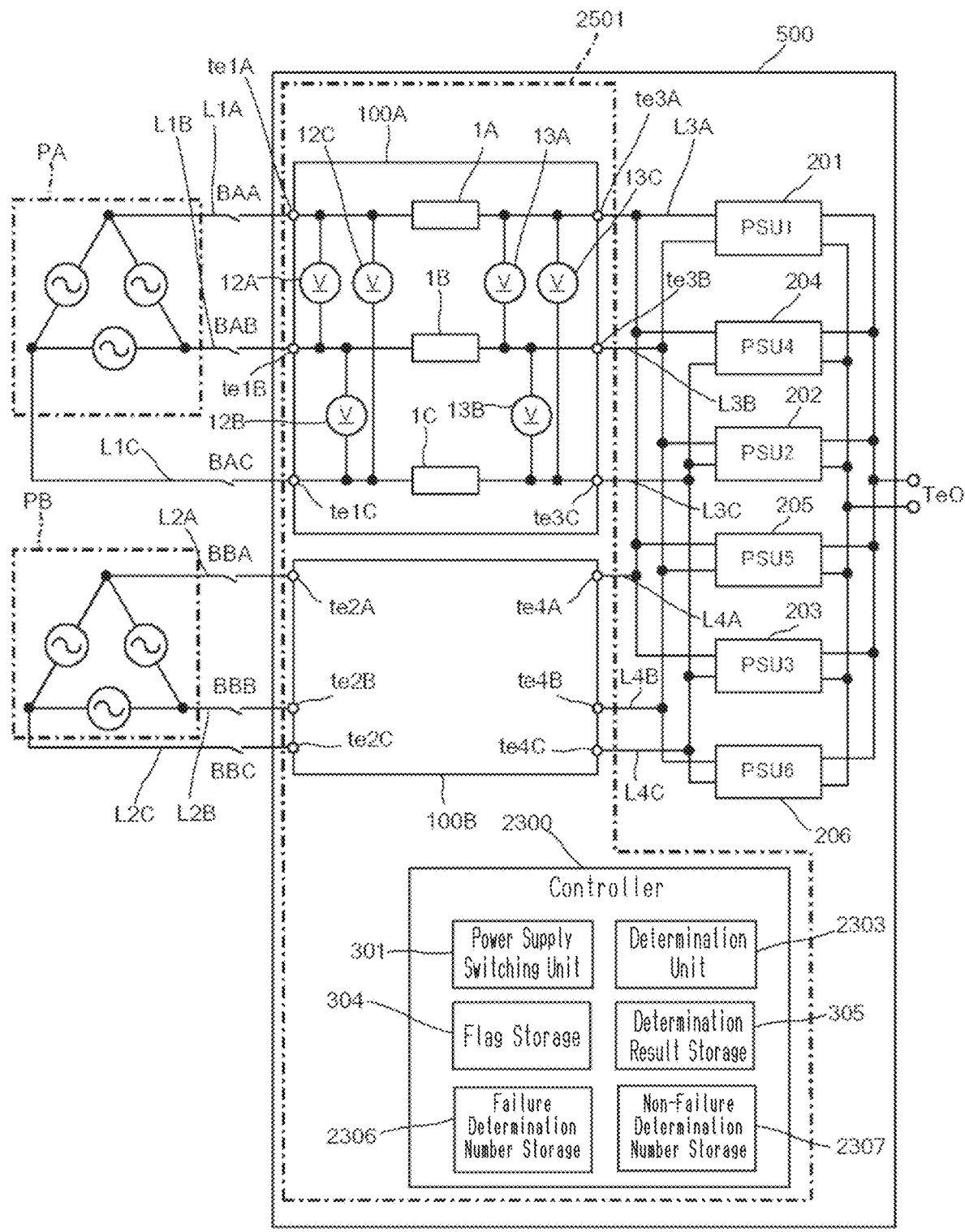
FIG. 8 is a schematic diagram of a power system according to a second preferred embodiment of the present invention.

As shown in FIG. 8, the power supply system in accordance with the present preferred embodiment has a hardware configuration similar to that of the power supply system in accordance with the first preferred embodiment. In FIG. 8, the same reference numerals denote components that are the same as or correspond to components of the first preferred embodiment shown in FIG. 1. A controller 2300 has the same or substantially the same hardware configuration as the controller 300 and is configured or programmed to include the power supply switch 301 and a determiner 2303. In the same or similar manner as the first preferred embodiment, the module main bodies 100A and 100B and the controller 2300 define a switching module 2501.

The determiner 2303 executes a short circuit determination process to determine whether the bidirectional switches 1A, 1B, and 1C have short circuit failures. An example of a case in which the determiner 2303 determines whether the bidirectional switch 1A has a failure will now be described. As shown in FIG. 4, the determiner 2303 first turns off the switching elements Q1A and Q2A and turns on the switching elements Q1B and Q2B from a first time point T1 over testing period ΔTA1, which has a length of less than or equal to one-half of the set cycle T0 that is set in advance of the AC current supplied from the three-phase AC power supply PA. The determiner 2303 executes a first determination process that repeatedly determines whether the differential absolute value (first differential value) of the voltage value detected by the voltmeter 12A and the voltage value detected by the voltmeter 13A is less than or equal to a preset first voltage threshold value and determines that the first bidirectional switch 1A has a short circuit failure when successively determining that the differential absolute value is less than or equal to the first voltage threshold value for a number of times that is greater than or equal to a preset first number threshold value. The first voltage threshold value is set to, for example, about 10 V. The first number threshold value is set to, for example, 10.

A case in which the determiner 2303 determines in the first determination process that the bidirectional switch 1A is functioning normally will now be described. As shown in FIG. 4, in this case, the determiner 2303 turns on the switching elements Q1A, Q2A, Q1B, and Q2B and charges the capacitor C1 from the first time point T1 to when a period of n+½ times, where n is a positive integer, the set cycle T0, which is preset, elapses. Then, the determiner 2303 performs a second test from a second time point T2 after period ΔT0 (1+½), which is 1+½ times the set cycle T0, elapses from the first time point T1. In the second testing period ΔTA2, the switching elements Q1A and Q2A are turned off and the switching elements Q1B and Q2B are turned on. The determiner 2303 opens the bidirectional switch 1A and closes the bidirectional switch 1B during the testing period ΔTA2 that is included in a period during which the polarity of the AC current Iin is negative. Then, the determiner 2303 executes a second determination process that repeatedly determines whether the differential absolute value (second differential value) of the voltage value detected by the voltmeter 12A and the voltage value detected by the voltmeter 13A is less than or equal to the first voltage threshold value and determines that the first bidirectional switch 1A has a short circuit failure when successively determining that the differential absolute value is less than or equal to the first voltage threshold value for a number of times that is greater than or equal to the first number threshold value.

When the determiner 2303 determines in the first determination process that the bidirectional switch 1A has a short circuit failure, the determiner 2303 does not execute the second determination process. Further, the determiner 2303 determines that the bidirectional switch 1A is functioning normally when successively determining in the first determination process that the differential absolute value is greater than the first voltage threshold value for a number of times that is greater than or equal to a preset second number threshold value and successively determining in the second determination process that the differential absolute value is greater than the first voltage threshold value for a number of times that is greater than or equal to the second number threshold value. The second number threshold value is greater than the first number threshold value and set to, for example, 40.

Further, the determiner 2303 repetitively determines in the first determination process whether the differential absolute value of the voltage value detected by the voltmeter 12A and the voltage value detected by the voltmeter 13A is greater than a preset second voltage threshold value. When successively determining that the differential absolute value is greater than the second voltage threshold value for a number of times that is greater than or equal to a preset third number threshold value, the determiner 2303 then executes the second determination process. The second voltage threshold value is higher than the first voltage threshold value and set to, for example, about 15 V. The third number threshold value is set to, for example, 20. In the second determination process, the determiner 2303 repeatedly determines whether the differential absolute value of the voltage value detected by the voltmeter 12A and the voltage value detected by the voltmeter 13A is less than or equal to the second voltage threshold value and determines that the first bidirectional switch 1A is functioning normally when successively determining that the differential absolute value is greater than the second voltage threshold value for a number of times that is greater than or equal to the third number threshold value.

The controller 2300 includes a memory including failure determination number storage 2306 and non-failure determination number storage 2307. The failure determination number storage 2306 stores information indicating a failure determination number that is the number of times the differential absolute value is determined to be less than or equal to the first voltage threshold value. The non-failure determination number storage 2307 stores information indicating a non-failure determination number that is the number of times the differential absolute value is determined to be greater than the second voltage threshold value.

Figure 9:
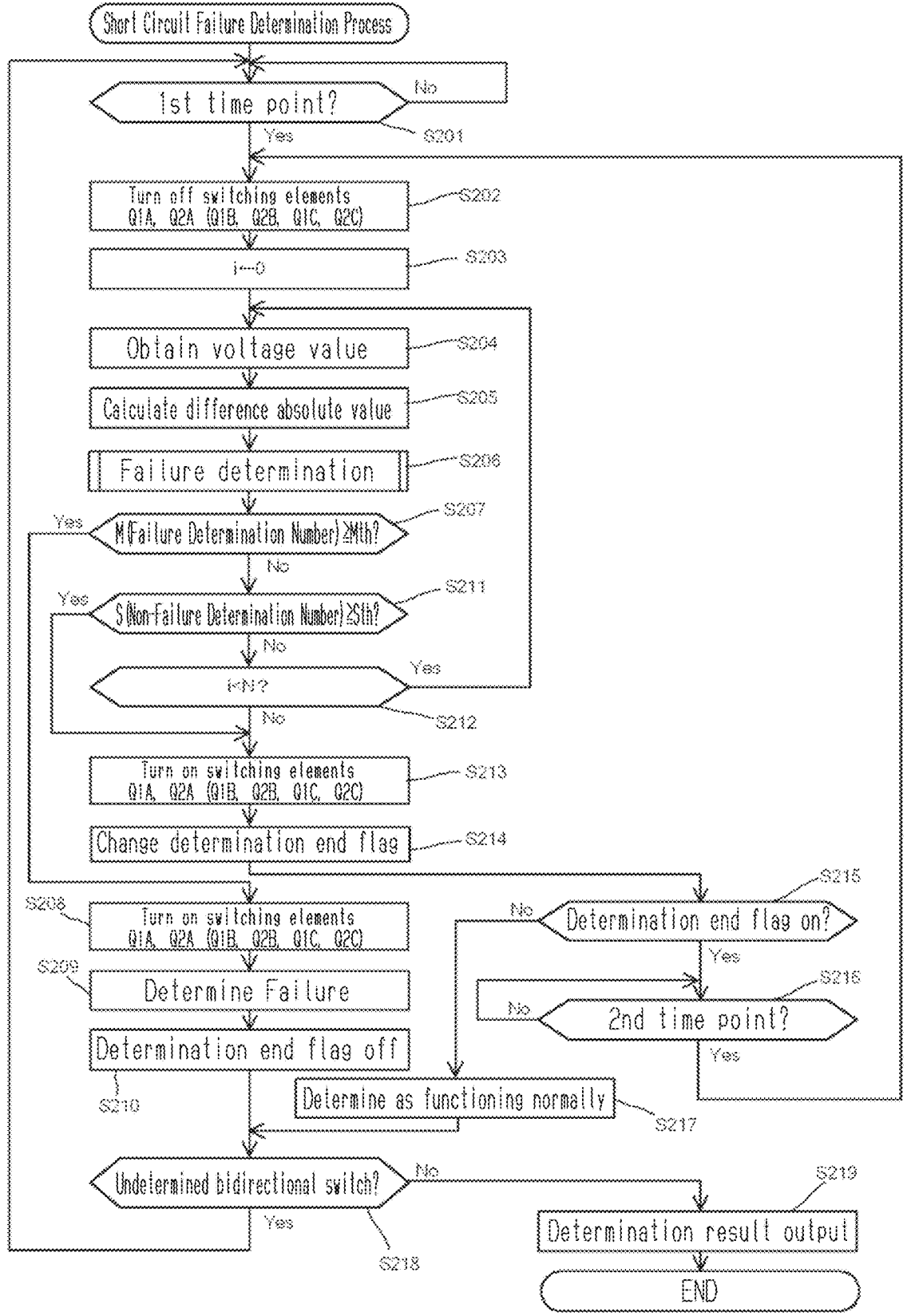
FIG. 9 is a flowchart illustrating a short circuit failure determination process executed by a determiner in the second preferred embodiment of the present invention.
Figure 10:
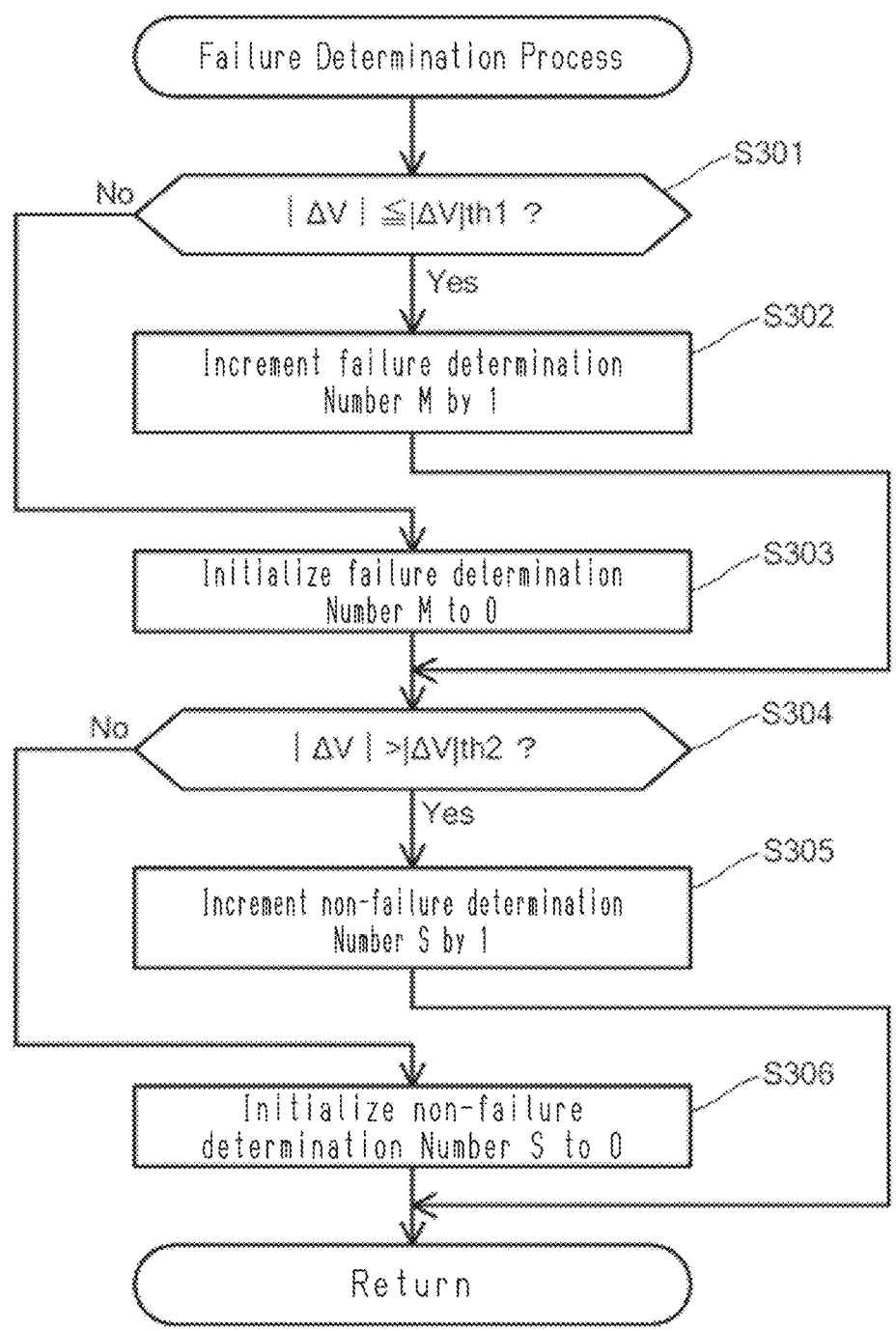
FIG. 10 is a flowchart illustrating the failure determination process executed by a determiner in the second preferred embodiment of the present invention.

The short circuit determination process executed by the determiner 2303 of the present preferred embodiment will now be described with reference to FIGS. 9 and 10. The bidirectional switches 1A, 1B, and 1C of the module main body 100A are all closed when the short circuit failure determination process starts. Further, for the one of the bidirectional switches 1A (1B, 1C) that is the subject of determination, the determination end flag, which indicates whether the short circuit failure determination has ended, is set to a state indicating off with the bidirectional switch 1A (1B, 1C) turned off during the testing period from the first time point. As shown in FIG. 9, the determiner 2303 first performs steps S201 to S203, which correspond to steps S1 to S3 described in the first preferred embodiment. In step S204, the determiner 2303 obtains a voltage value from each of the voltmeters 12A and 13A (12B, 13B, 12C, 13C). In step S205, the determiner 2303 calculates the differential absolute value of the two obtained voltage values.

In step S206, the determiner 2303 executes a failure determination process to determine whether the bidirectional switches 1A, 1B, and 1C have short circuit failures based on the calculated differential absolute value. As shown in FIG. 10, in the failure determination process, the determiner 2303 determines in step S301 whether the differential absolute value |ΔV| is less than or equal to the first voltage threshold value |ΔV|th1. When the determiner 2303 determines that the differential absolute value |ΔV| is less than or equal to the first voltage threshold value |ΔV|th1 (step S301: Yes), the determiner 2303 proceeds to step S302 and updates a failure determination number M stored in the failure determination number storage 2306 by incrementing the failure determination number M by 1. Then, the determiner 2303 proceeds to step S304, which will be described later. When the determiner 2303 determines that the differential absolute value |ΔV| is greater than the first voltage threshold value |ΔV|th1 (step S301: No), the determiner 2303 proceeds to step S303 and initializes the failure determination number M, which is stored in the failure determination number storage 2306, to 0. In step S304, the determiner 2303 determines whether the differential absolute value |ΔV| is greater than the second voltage threshold value |ΔV|th2. When the determiner 2303 determines that the differential absolute value |ΔV| is greater than the second voltage threshold value |ΔV|th2 (step S304: Yes), the determiner 2303 proceeds to step S305 and updates a non-failure determination number S stored in the non-failure determination number storage 2307 by incrementing the non-failure determination number S by 1. When the determiner 2303 determines that the differential absolute value |ΔV| is less than or equal to the second voltage threshold value |ΔV|th2 (step S304: No), the determiner 2303 proceeds to step S306 and initializes the non-failure determination number S, which is stored in the non-failure determination number storage 2307, to 0. Then, the determiner 2303 proceeds to step S207 of FIG. 9.

After performing step S206, the determiner 2303 proceeds to step S207 and refers to the failure determination number storage 2306 to determine whether the failure determination number M is greater than or equal to a first number threshold value Mth. When the determiner 2303 determines that the failure determination number M is greater than or equal to the first number threshold value Mth (step S207: Yes), the determiner 2303 proceeds to step S208 and turns on the switching elements Q1A and Q2A (Q1B, Q2B, Q1C, Q2C). In this case, the determiner 2303 initializes the count value of the counter to 0 and initializes both of the failure determination number, which is stored in the failure determination number storage 2306, and the non-failure determination number, which is stored in the non-failure determination number storage 2307, to 0. In step S209, the determiner 2303 determines that the bidirectional switch 1A (1B, 1C) has a short circuit failure. In this case, the determiner 2303 stores failure determination information, which indicates that the bidirectional switch 1A (1B, 1C) has a short circuit failure, in association with identification information of the bidirectional switch 1A (1B, 1C), which is the subject of determination, in the determination result storage 305. In step S210, the determiner 2303 sets the determination end flag, which is stored in the flag storage 304, to off. In this case, if the determination end flag stored in the flag storage 304 had already been set to off, the determiner 2303 maintains the off state of the determination end flag. In this manner, when the determiner 2303 determines in the first determination process that the bidirectional switch 1A has a short circuit failure, the determiner 2303 avoids execution of the second determination process. Then, the determiner 2303 performs step S218, which will be described later.

When the determiner 2303 determines that the failure determination number M is less than the first number threshold value Mth (step S207: No), the determiner 2303 proceeds to step S211 and refers to the non-failure determination number storage 2307 to determine whether the non-failure determination number S is greater than or equal to the third number threshold value Sth. When the determiner 2303 determines that the non-failure determination number S is greater than or equal to the third number threshold value Sth (step S211: Yes), the determiner 2303 performs step S213, which will be described later. When the determiner 2303 determines that the non-failure determination number S is less than the third number threshold value Sth (step S211: No), the determiner 2303 proceeds to step S212 and determines whether the count value i is less than the second number threshold value N. When the determiner 2303 determines that the count value i is less than the second number threshold value N (step S212: Yes), the determiner 2303 performs step S204 again.

When the determiner 2303 determines that the count value i is greater than or equal to the second number threshold value N (step S212: No), the determiner proceeds to step S213 and turns on the switching elements Q1A and Q2A (Q1B, Q2B, Q1C, Q2C). In this case, the determiner 2303 initializes the count value of the counter to 0 and initializes both of the failure determination number, which is stored in the failure determination number storage 2306, and the non-failure determination number, which is stored in the non-failure determination number storage 2307, to 0. In step S214, the determiner 2303 changes the determination end flag stored in the flag storage 304. In this case, if the determination end flag had been set to on, the determiner 2303 changes the determination end flag to off. If the determination end flag had been set to off, the determiner 2303 sets the determination end flag to on.

In step S215, the determiner 2303 determines whether the determination end flag is set to on. When the determiner 2303 determines that the determination end flag is set to on (step S215: Yes), the determiner 2303 proceeds to step S216 and determines whether it is the second time point. As long as the second time point has not been reached (step S216: No), the determiner 2303 repeats step S216. When the determiner 2303 determines that it is the second time point (step S216: Yes), the determiner 303 performs the processes from step S202 again.

When the determiner 2303 determines in step S215 that the determination end flag is off (step S215: No), the determiner 2303 proceeds to step S217 and determines that the bidirectional switch 1A (1B, 1C) is functioning normally. In this case, the determiner 2303 stores normality determination information, which indicates that the bidirectional switch 1A (1B, 1C) is functioning normally, in association with the identification information of the bidirectional switch 1A (1B, 1C), which is the subject of determination, in the determination result storage 305.

In step S218, the determiner 2303 determines whether short circuit failure is undetermined for any one of the bidirectional switches 1A, 1B, and 1C from the completion flag stored in the flag storage 304. When the determiner 2303 determines that short circuit failure is undetermined for any one of the bidirectional switches 1A, 1B, and 1C (step S218: Yes), the determiner 2303 performs the processes from step S201 on the undetermined bidirectional switch 1A (1B, 1C). When the determiner 2303 determines than there is no bidirectional switch 1A (1B, 1C) for which short circuit failure is undetermined (step S218: No), the determiner 2303 proceeds to step S219. Step S219 corresponds to step S17 described in the first preferred embodiment.

As described above, with the switching module 2501 of the present preferred embodiment, the determiner 2303 determines in the short circuit failure determination process that the bidirectional switch 1A (1B, 1C) has a short circuit failure only when a short circuit failure is determined for a number of times corresponding to the first number threshold value Mth. This reduces the effect of sporadic changes in the differential absolute value of the voltage value detected by the voltmeter 12A and the voltage value detected by the voltmeter 13A. Thus, the accuracy for determining short circuit failure of the bidirectional switch 1A (1B, 1C) is increased.

With the switching module 2501 in accordance with the present preferred embodiment, when the determiner 2303 determines in the first determination process that the bidirectional switch 1A has a short circuit failure, the determiner 2303 does not execute the second determination process. This shortens the period during which the bidirectional switches 1A, 1B, and 1C are open and minimizes decreases in the power supplied to a load R.

Further, with the switching module 2501 in accordance with the present preferred embodiment, when the determiner 2303 successively determines in the first determination process that the differential absolute value $|\Delta V|$ is greater than the second voltage threshold value $|\Delta V|th2$ for a number of times greater than or equal to the third number threshold value Sth, the determiner 2303 then executes the second determination process. This reduces the number of times the first determination process is executed and shortens the period during which the bidirectional switches 1A, 1B, and 1C are open. Thus, decreases are minimized in the power supplied to the load R. Further, the inrush current that flows to the power conversion circuits 201, 202, 203, 204, 205, and 206 is reduced.

The present disclosure is not limited to the preferred embodiments described above. For example, the controller 300 may be included in a switching module. Further, a switching module may include only a portion of the controller 300 (power supply switch 301). Alternatively, a switching module may be a set of a single module main body and a single controller.

Figure 11:
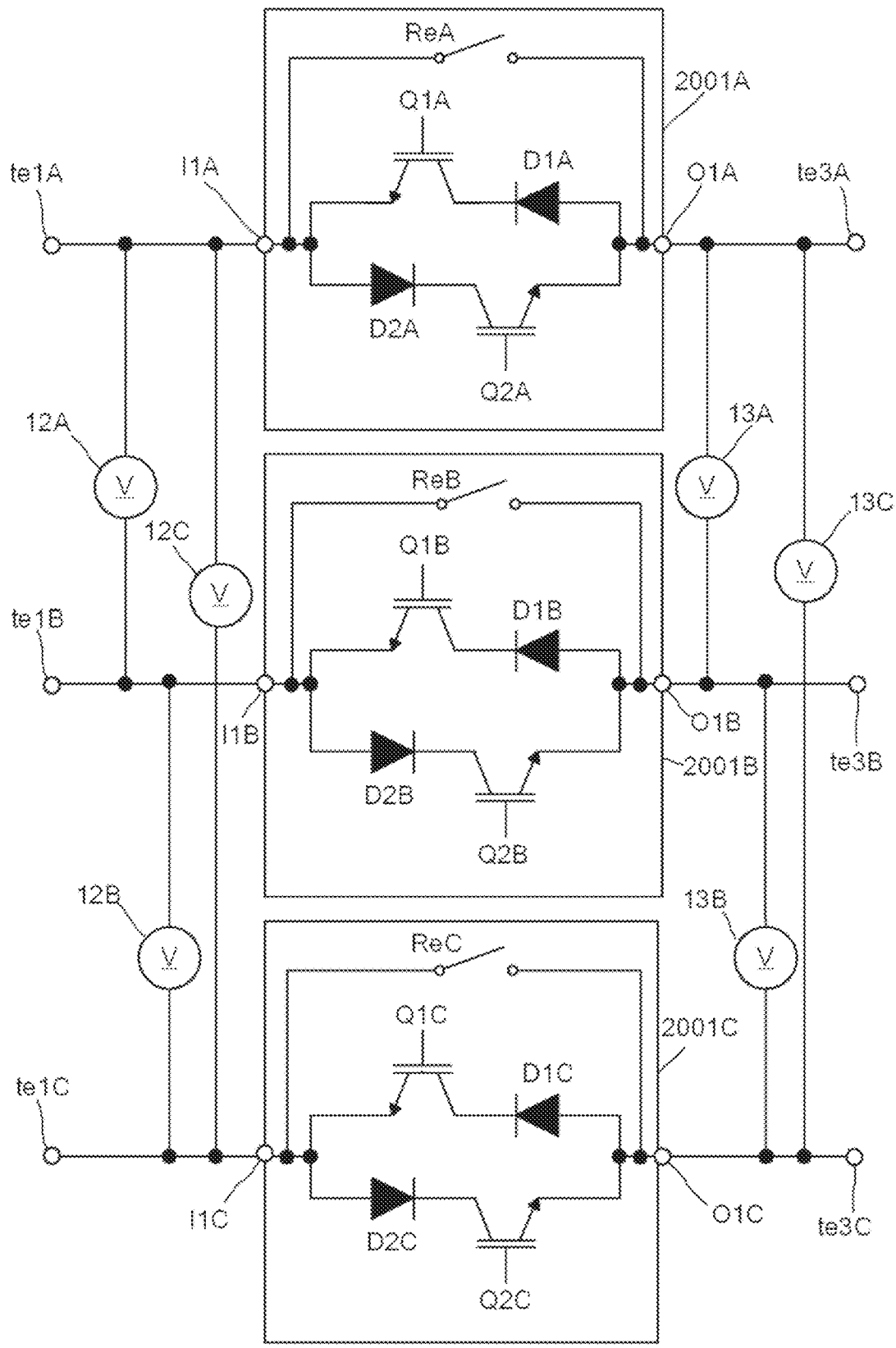
FIG. 11 is a circuit diagram showing a portion of a module body in a modified example of a preferred embodiment of the present invention.

Further, in a modified example of a preferred embodiment of the present invention shown in FIG. 11, bidirectional switches 2001A, 2001B, and 2001C may be composite bidirectional switches that includes the relay switches ReA, ReB, and ReC. In FIG. 11, the same reference numerals denote components that are the same as or correspond to components of the preferred embodiment shown in FIG. 3. With this switching module, when setting the source of the power supplied to the power supply system 500 to the three-phase AC power supply PA, the power supply switch 301 closes the three bidirectional switches 2001A, 2001B, and 2001C and the relay switches ReA, ReB, and ReC of the module main body 100A and opens the three bidirectional switches (not shown) and the relay switches ReA, ReB, and ReC of the module main body 100B. When setting the source of the power supplied to the power supply system 500 to the backup three-phase power supply PB, the power supply switch 301 opens the three bidirectional switches 2001A, 2001B, and 2001C and the relay switches ReA, ReB, and ReC of the module main body 100A. When the relay switches ReA, ReB, and ReC are, for example, electromagnetic relays including coils, the power supply switch 301 controls the current flowing to the coils of the relay switches ReA, ReB, and ReC to turn on or turn off the relay switches ReA, ReB, and ReC.

In the short circuit failure determination process executed by the determiner 303 of the present modified example, in step S2 of the short circuit failure determination process illustrated in FIG. 6 in the description of the above preferred embodiment, the switching elements Q1A and Q2A (Q1B, Q2B, Q1C, Q2C) are turned off and the relay switch ReA (ReB, ReC) is opened. Further, in the short circuit failure determination process of the present modified example, in step S8 of the short circuit failure determination process illustrated in FIG. 6, the switching elements Q1A and Q2A (Q1B, Q2B, Q1C, Q2C) are turned on and the relay switch ReA (ReB, ReC) is closed.

Figure 12:
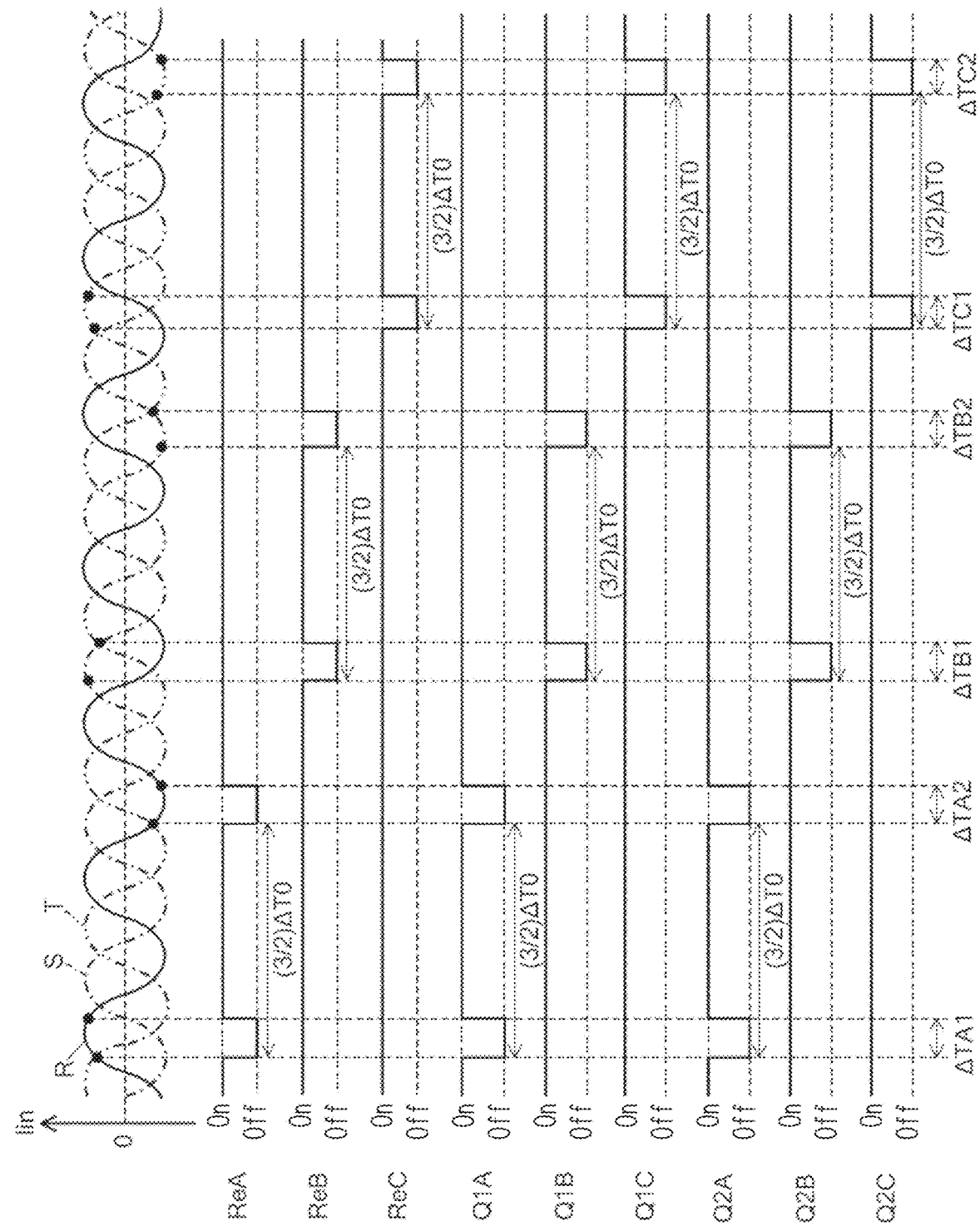
FIG. 12 is a time chart illustrating the operation of the switching module in the modified example.

The determiner 303 executes the short circuit failure determination process to, for example, turn the switching elements Q1A, Q1B, Q1C, Q2A, Q2B, and Q2C on and off and switch the relay switches ReA, ReB, and ReC between open and closed states in the bidirectional switches 2001A, 2001B, and 2001C, as shown in FIG. 12. More specifically, the determiner 303 first turns off the switching elements Q1A and Q2A and opens the relay switch ReA in the bidirectional switch 2001A when the polarity of the R-phase AC current flowing through the power line L1A is positive in period ΔTA1 and negative in period ΔTA2 to determine whether the bidirectional switch 2001A has a short circuit failure. Then, the determiner 303 turns off the switching elements Q1B and Q2B and opens the relay switch ReB in the bidirectional switch 2001B when the polarity of the S-phase AC current flowing through the power line L1B is positive in period ΔTB1 and negative in period ΔTB2 to determine whether the bidirectional switch 2001B has a short circuit failure. Afterwards, the determiner 303 turns off the switching elements Q1C and Q2C and opens the relay switch ReC in the bidirectional switch 2001C when the polarity of the T-phase AC current flowing through the power line L1C is positive in period ΔTC1 and negative in period ΔTC2 to determine whether the bidirectional switch 2001C has a short circuit failure.

With the present configuration, short circuit failure can be determined for the bidirectional switches 2001A, 2001B, and 2001C that include the relay switches ReA, ReB, and ReC.

Figure 13:
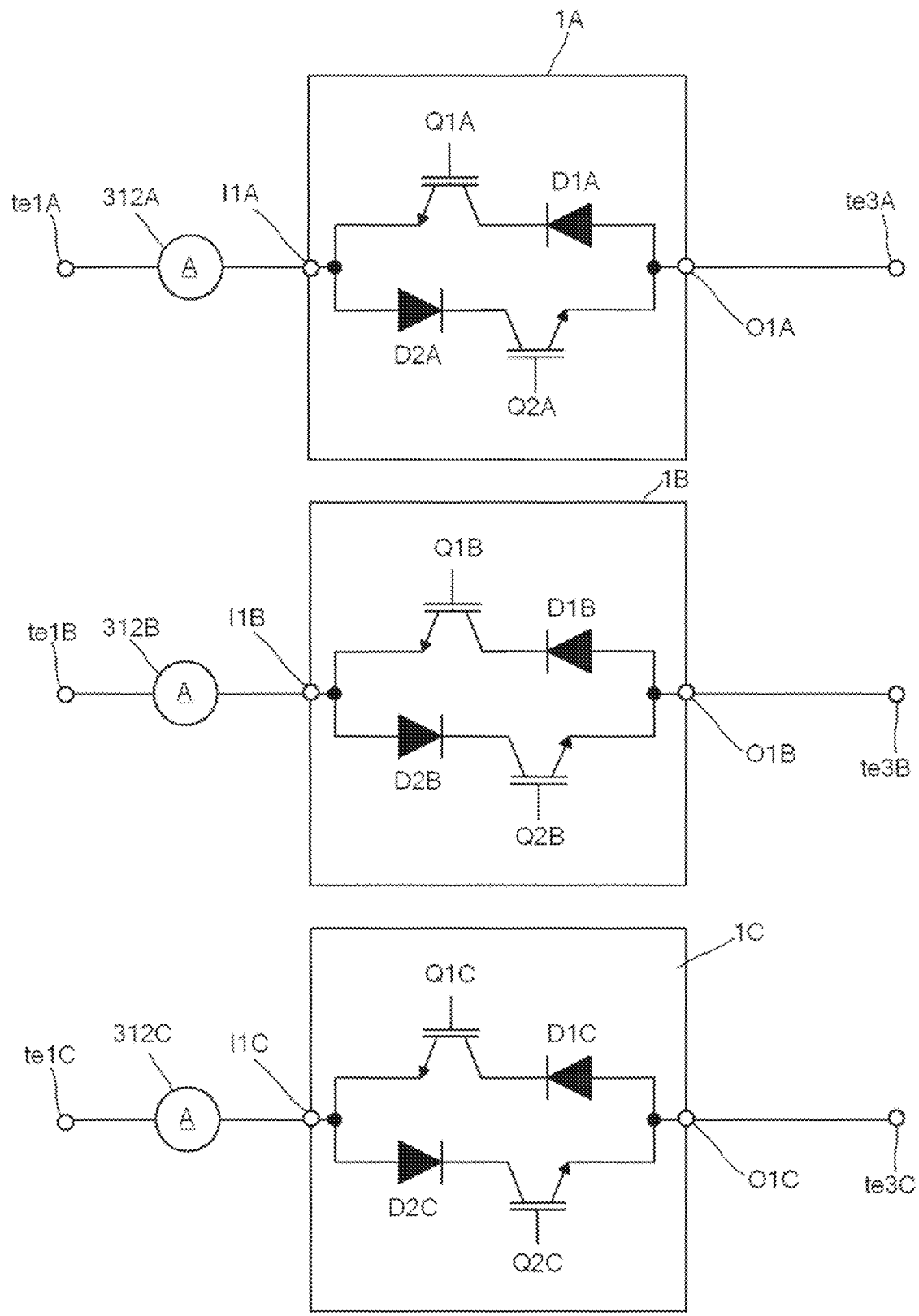
FIG. 13 is a circuit diagram showing a portion of a switching module in the modified example.

In the above-described preferred embodiments, the voltmeters 12A, 12B, 12C, 13A, 13B, and 13C are used in the examples of a switching module. Instead, as shown in the example of FIG. 13, a switching module may include ammeters 312A, 312B, and 312C connected in series to the bidirectional switches 1A, 1B, and 1C. The ammeter 312A detects a current value (first current value) of the current flowing between the input terminal te1A and the bidirectional switch 1A, and the ammeter 312B detects a current value (second current value) of the current flowing between the input terminal te1B and the bidirectional switch 1B. Further, the ammeter 312C detects a current value of the current flowing between the input terminal te1C and the bidirectional switch 1C.

The determiner 303 of the present modified example, determines whether, for example, the bidirectional switch 1A has a short circuit failure. The determiner 303 opens the bidirectional switch 1A and closes the bidirectional switch 1B from a first time point over a testing period, which is less than or equal to one-half of the set cycle, to obtain the current value detected by the ammeter 312A. The bidirectional switch 1A is determined as having a short circuit failure when the current value measured by the ammeter 312A exceeds a first current threshold value. Further, when the determiner 303 determines from the current value obtained from the first time point to when the testing period elapses that the bidirectional switch 1A is functioning normally, the determiner 303 opens the bidirectional switch 1A and closes the bidirectional switch 1B from a second time point, which is after a period of n+½ times, where N is a positive integer, the set cycle from the first time point elapses, over the testing period, and determines that the bidirectional switch 1A has a short circuit failure if the current value detected by the ammeter 312A is greater than or equal to the first current threshold value.

The bidirectional switch 1A is open when it does not have a short circuit failure. Thus, when the current value detected by the ammeter 312A is smaller than the first current threshold value, it may be determined that there is no short circuit failure. The bidirectional switch 1A corresponds to the first bidirectional switch, and the bidirectional switch 1B corresponds to the second bidirectional switch. The ammeter 312A corresponds to the ammeter. The elements are the equivalences in the present preferred embodiment, and the claims are not limited to these elements.

Figure 14:
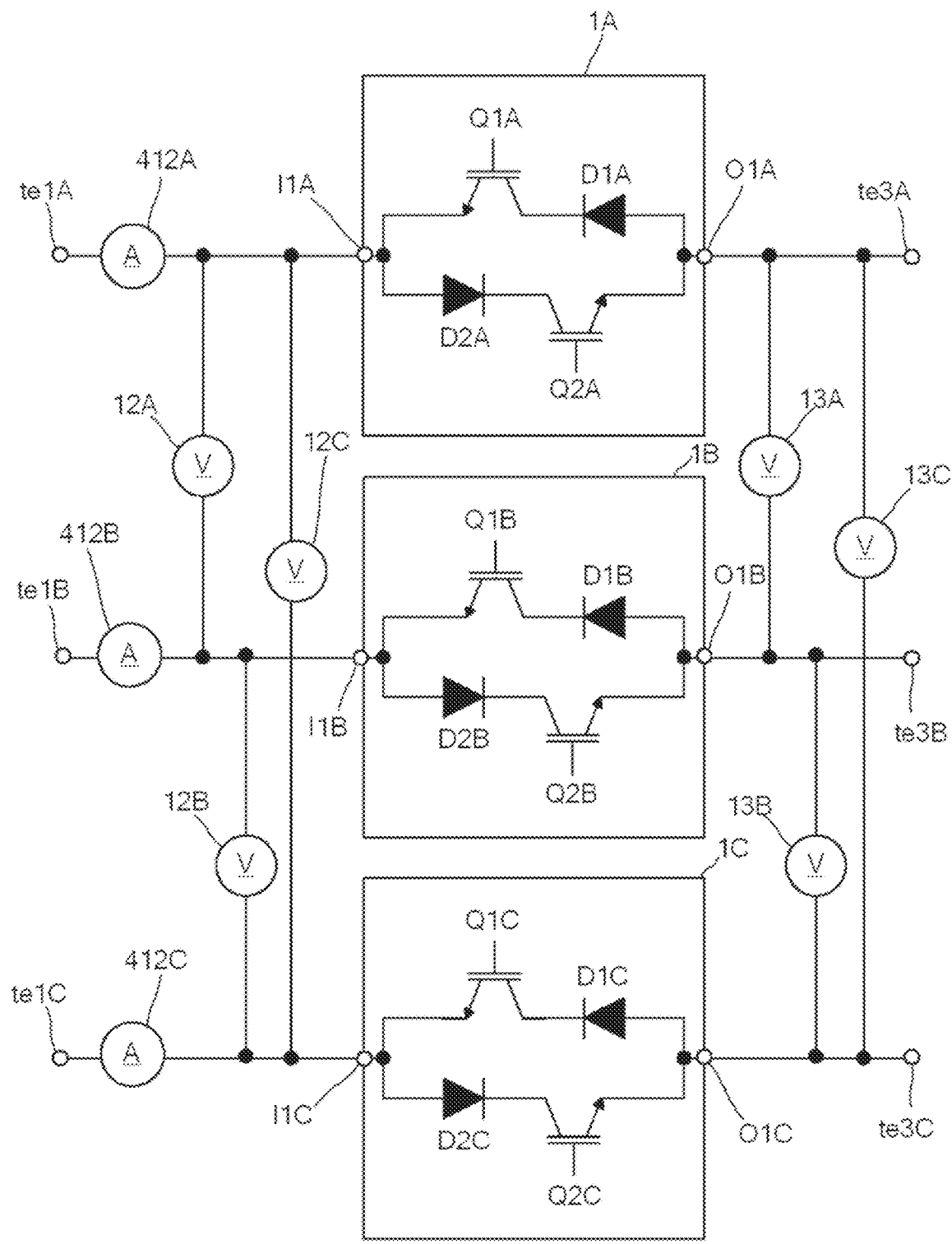
FIG. 14 is a circuit diagram showing a portion of the switching module in the modified example.

In the second preferred embodiment, as shown in the example shown in FIG. 14, the switching module 2501 may include ammeters 412A, 412B, and 412C that detect the current flowing between the input terminals te1A, te1B, and te1C and the output terminals te3A, te3B, and te3C. In this case, the determiner 2303 may increase the first number threshold value Mth by a preset number when the current values detected by the ammeters 412A, 412B, and 412C immediately before the testing period (first testing period) ΔTA1 described in the first preferred embodiment is less than or equal to a preset second current threshold value. For example, the first number threshold value Mt may be increased from 10 to 15. In this case, the determiner 2303 may increase at least one of the second number threshold value N and the third number threshold value Sth by a preset number. For example, the second number threshold value N may be increased from 40 to 60, and the third number threshold value Sth may be increased from 20 to 30.

Further, the determiner 2303 may decrease the first number threshold value Mth by a preset number when the current values detected by the ammeters 412A, 412B, and 412C immediately before the testing period is higher than a preset third current threshold value. For example, the first number threshold value may be decreased from 10 to 5. In this case, the determiner 2303 may decrease at least one of the second number threshold value N and the third number threshold value Sth by a present number. For example, the second number threshold value N may be decreased from 40 to 35, and the third number threshold value Sth may be decreased from 20 to 15.

With the present configuration, when the current values detected by the ammeters 412A, 412B, and 412C are less than or equal to the second current threshold value, that is, when the load is relatively light, the number of times to repeat the first determination process or the second determination process is increased. This improves the accuracy for determining whether the bidirectional switch 1A (1B, 1C) has a short circuit failure. When the current values detected by the ammeters 412A, 412B, and 412C are higher than the third current threshold value, that is, when the load is relatively heavy, the number of times to repeat the first determination process or the second determination process is decreased. This allows the power supplied to the load to be decreased.

The above-described preferred embodiments describe examples of the power supply system 500 that is supplied with power from the three-phase AC power supplies PA and PB. Instead, a power supply system may be supplied with, for example, two-phase AC power via two power lines from a two-phase AC power supply. Alternatively, for example, a power supply system may be supplied with AC power through a three-phase-four-line configuration.

In the above-described preferred embodiments, the power supply system 500 may include a communication unit (not shown) that communicates with an external device. In this case, the controller 300 may include a result transmitter that obtains determination result information indicating the determination result of whether the bidirectional switches 1A, 1B, and 1C have short circuit failures from the determination result storage 305 and transmits the obtained determination result information via the communication unit to the external device.

The present disclosure is not limited to the preferred embodiments and modified examples described above. The present invention includes combinations of the preferred embodiments and modified examples and changes made to the preferred embodiments and modified examples.

This application is based upon Japanese Patent Application No. 2018-242050, filed on Dec. 26, 2018, and Japanese Patent Application No. 2019-089527, filed on May 10, 2019. The specification, claims, and drawings of Japanese Patent Application No. 2018-242050 and the specification, claims, and drawings of Japanese Patent Application No. 2019-089527 are entirely incorporated herein by reference.

Preferred embodiments of the present invention are suitable for a power supply system of a server, for example.

Various changes in configuration and details may be made to the examples above without departing from the spirit and scope of the claims and their equivalents. The examples are for the sake of description only, and not for purposes of limitation. Descriptions of features in each example are to be considered as being applicable to similar features or elements in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switching module comprising:
at least one combination of two input terminals, to which an AC voltage of a set cycle that is set in advance is applied, and two output terminals, which are connected to a power conversion circuit; wherein
a combination of the two input terminals and the two output terminals selected from the at least one combination of the two input terminals and the two output terminals includes:
a first bidirectional switch connected in series between one of the two input terminals and one of the two output terminals;
a second bidirectional switch connected in series between another one of the two input terminals and another one of the two output terminals;
a first voltmeter to detect a first voltage value corresponding to an electric potential difference of an electric potential between the one of the two input terminals and the first bidirectional switch and an electric potential between the another one of the two input terminals and the second bidirectional switch;
a second voltmeter to detects a second voltage value corresponding to an electric potential difference of an electric potential between the one of the two output terminals and the first bidirectional switch and an electric potential between the another one of the two output terminals and the second bidirectional switch; and
a determiner to determine whether the first bidirectional switch has a short circuit failure, wherein the determiner opens the first bidirectional switch and closes the second bidirectional switch from a first time point over a first testing period, which has a length of less than or equal to one-half of the set cycle, to obtain the first voltage value and the second voltage value and determine that the first bidirectional switch has a short circuit failure when a first differential value of the obtained first voltage value and the obtained second voltage value is less than or equal to a preset first voltage threshold value, and when determining from the first voltage value and the second voltage value, which are obtained from the first time point to when the first testing period elapses, that the first bidirectional switch is functioning normally, the determiner opens the first bidirectional switch and closes the second bidirectional switch from a second time point, which is after a period corresponding to at least one cycle of the set cycle elapses from the first time point and when a polarity of the AC voltage differs from that at the first time point, over a second testing period, which has a length of less than or equal to one-half of the set cycle, to obtain the first voltage value and the second voltage value and determine that the first bidirectional switch has a short circuit failure when a second differential value of the obtained first voltage value and the obtained second voltage value is less than or equal to the first voltage threshold value.

2. The switching module according to claim 1, wherein the first voltmeter is connected to an input terminal of the first bidirectional switch and an input terminal of the second bidirectional switch; and the second voltmeter is connected to an output terminal of the first bidirectional switch and an output terminal of the second bidirectional switch.

3. The switching module according to claim 1, wherein the length of the first testing period and the length of the second testing period are about 0.3 times or greater and about 0.5 times or less than the set cycle.

4. The switching module according to claim 1, wherein the first bidirectional switch includes:
a first switch including one end connected to the one of the two input terminals;
a first diode including a cathode connected to another end of the first switch and an anode connected to the one of the two output terminals;
a second diode including an anode connected to the one of the two input terminals; and
a second switch including one end connected to a cathode of the second diode and another end connected to the one of the two output terminals; and
the second bidirectional switch includes:
a third switch including one end connected to the another one of the two input terminals;
a third diode including a cathode connected to another end of the third switch and an anode connected to the another one of the two output terminals;
a fourth diode including an anode connected to the another one of the two input terminals; and
a fourth switch including one end connected to a cathode of the fourth diode and another end connected to the another one of the two output terminals.

5. The switching module according to claim 1, wherein when the determiner determines from the first voltage value and the second voltage value, which are obtained from the first time point to when the first testing period elapses, that the first bidirectional switch has a short circuit failure, the determiner does not determine whether the first bidirectional switch has a short circuit failure at the second time point.

6. A power supply system comprising:
module main bodies;
power conversion circuits; and
a controller; wherein
the module main bodies and the controller define the switching module according to claim 1.

7. The power supply system according to claim 6, wherein each of the power conversion circuits includes:
a rectification circuit;
a smoothing capacitor connected between output terminals of the rectification circuit;
a DC-DC converter; and
a ripple current reducing capacitor connected between output terminals of the DC-DC converter.

8. A switching module comprising:
at least one combination of two input terminals, to which AC voltage of a set cycle that is set in advance is applied, and two output terminals, which are connected to a power conversion circuit;
a combination of the two input terminals and the two output terminals selected from the at least one combination of the two input terminals and the two output terminals includes:
a first bidirectional switch connected in series between one of the two input terminals and one of the two output terminals;
a second bidirectional switch connected in series between another one of the two input terminals and another one of the two output terminals;
an ammeter to detect a current value of a current flowing between the one of the two input terminals and the first bidirectional switch; and
a determiner to determine whether the first bidirectional switch has a short circuit failure, wherein the determiner opens the first bidirectional switch and closes the second bidirectional switch from a first time point over a first testing period, which has a length of less than or equal to one-half of the set cycle, to obtain the current value and determine that the first bidirectional switch has a short circuit failure when the obtained current value is greater than or equal to a preset first current threshold value, and when determining from the current value, which is obtained from the first time to when the first testing period elapses, that the first bidirectional switch is functioning normally, the determiner opens the first bidirectional switch and closes the second bidirectional switch from a second time point, which is after a period corresponding to at least one cycle of the set cycle elapses from the first time point and when a polarity of the AC voltage differs from that at the first time point, to obtain the current value and determine that the first bidirectional switch has a short circuit failure when the obtained current value is greater than or equal to the first current threshold value.

9. A power supply system comprising:
module main bodies;
power conversion circuits; and
a controller; wherein
the module main bodies and the controller define the switching module according to claim 8.

10. The power supply system according to claim 9, wherein each of the power conversion circuits includes:
a rectification circuit;
a smoothing capacitor connected between output terminals of the rectification circuit;
a DC-DC converter; and
a ripple current reducing capacitor connected between output terminals of the DC-DC converter.

11. A switching module comprising:
at least one combination of two input terminals, to which AC voltage of a set cycle that is set in advance is applied, and two output terminals, which are connected to a power conversion circuit;
a combination of the two input terminals and the two output terminals selected from the at least one combination of the two input terminals and the two output terminals includes:
a first bidirectional switch connected in series between one of the two input terminals and one of the two output terminals;
a second bidirectional switch connected in series between another one of the two input terminals and another one of the two output terminals;
a first voltmeter to detect a first voltage value corresponding to an electric potential difference of an electric potential between the one of the two input terminals and the first bidirectional switch and an electric potential between the another one of the two input terminals and the second bidirectional switch;
a second voltmeter to detect a second voltage value corresponding to an electric potential difference of an electric potential between the one of the two output terminals and the first bidirectional switch and an electric potential between the another one of the two output terminals and the second bidirectional switch; and a determiner to determine whether the first bidirectional switch has a short circuit failure; wherein the determiner executes a first determination process that opens the first bidirectional switch and closes the second bidirectional switch from a first time point over a first testing period, which has a length of less than or equal to one-half of the set cycle, obtains the first voltage value and the second voltage value to repetitively determine whether a first differential value of the first voltage value and the second voltage value is less than or equal to a preset first voltage threshold value, and determines that the first bidirectional switch has a short circuit failure when successively determining that the first differential value is less than or equal to the first voltage threshold value for a number of times that is greater than or equal to a preset first number threshold value, and the determiner executes a second determination process that opens the first bidirectional switch and closes the second bidirectional switch from a second time point, which is after a period corresponding to at least one cycle of the set cycle elapses from the first time point and when a polarity of the AC voltage differs from that at the first time point, over a second testing period, which has a length of less than or equal to one-half of the set cycle, obtains the first voltage value and the second voltage value to repetitively determine whether a second differential value of the first voltage value and the second voltage value is less than or equal to the first voltage threshold value, and determines that the first bidirectional switch has a short circuit failure when successively determining that the second differential value is less than or equal to the first voltage threshold value for a number of times that is greater than or equal to the first number threshold value.

12. The switching module according to claim 11, wherein when the determiner determines in the first determination process that the first bidirectional switch has a short circuit failure, the determiner does not execute the second determination process.

13. The switching module according to claim 11, wherein the determiner determines that the first bidirectional switch is functioning normally when successively determining in the first determination process that the first differential value is greater than the first voltage threshold value for a number of times that is greater than or equal to a second number threshold value, which is greater than the first number threshold value, and also successively determining in the second determination process that the second differential value is greater than the first voltage threshold value for a number of times that is greater than or equal to the second number threshold value.

14. The switching module according to claim 13, wherein in the first determination process, the determiner obtains the first voltage value and the second voltage value to repetitively determine whether the first differential value of the first voltage value and the second voltage value is greater than a second voltage threshold value, which is greater than the first voltage threshold value, and then executes the second determination process when successively determining that the first differential value is greater than the second voltage threshold value for a number of times that is greater than or equal to a third number threshold value that is less than the second number threshold value; and in the second determination process, the determiner obtains the first voltage value and the second voltage value to repetitively determine whether the second differential value of the first voltage value and the second voltage value is less than or equal to the second voltage threshold value, and determines that the first bidirectional switch is functioning normally when successively determining that the second differential value is greater than the second voltage threshold value for a number of times that is greater than or equal to the third number threshold value.

15. The switching module according to claim 11, further comprising:

an ammeter to detect a current value of a current flowing between the one of the two input terminals and the one of the output terminals; wherein the determiner increases at least the first number threshold value by a preset number when the current value detected by the ammeter at a time point immediately before the first testing period is less than or equal to a preset second current threshold value.

16. The switching module according to claim 11, further comprising:

an ammeter to detect a current value of a current flowing between the one of the two input terminals and the one of the output terminals; wherein the determiner decreases at least the first number threshold value by a preset number when the current value detected by the ammeter at a time point immediately before the first testing period is greater than a preset third current threshold value.

17. A power supply system comprising:
module main bodies;
power conversion circuits; and
a controller; wherein
the module main bodies and the controller define the switching module according to claim 11.

18. The power supply system according to claim 17, wherein each of the power conversion circuits includes:
a rectification circuit;
a smoothing capacitor connected between output terminals of the rectification circuit;
a DC-DC converter; and
a ripple current reducing capacitor connected between output terminals of the DC-DC converter.

* * * * *